(12) United States Patent
Ono

(10) Patent No.: US 9,201,277 B2
(45) Date of Patent: *Dec. 1, 2015

(54) LIQUID CRYSTAL PANEL, LIQUID CRYSTAL DISPLAY DEVICE, AND MANUFACTURING METHOD THEREOF

(71) Applicant: Panasonic Liquid Crystal Display Co., Ltd., Himeji-shi, Hyogo (JP)

(72) Inventor: Kikuo Ono, Chiba (JP)

(73) Assignee: Panasonic Liquid Crystal Display Co., Ltd., Hyogo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/611,864

(22) Filed: Feb. 2, 2015

(65) Prior Publication Data

US 2015/0146128 A1 May 28, 2015

Related U.S. Application Data

(63) Continuation of application No. 14/543,363, filed on Nov. 17, 2014, which is a continuation of application No. 13/306,416, filed on Nov. 29, 2011, now Pat. No. 8,917,370.

(30) Foreign Application Priority Data

Nov. 30, 2010 (JP) .................................. 2010-266443

(51) Int. Cl.
*G02F 1/1343* (2006.01)
*H01L 27/12* (2006.01)
*H01L 29/417* (2006.01)
(Continued)

(52) U.S. Cl.
CPC ........ *G02F 1/134363* (2013.01); *G02F 1/1362* (2013.01); *G02F 1/1368* (2013.01); *G02F 1/13458* (2013.01); *G02F 1/136227* (2013.01); *G02F 1/136286* (2013.01); *H01L 27/1288* (2013.01); *H01L 29/41733* (2013.01); *G02F 2001/13629* (2013.01); *G02F 2001/134372* (2013.01); *G02F 2001/136231* (2013.01);
(Continued)

(58) Field of Classification Search
CPC ..................... G02F 1/134363; G02F 1/136286
USPC ................................................. 349/139, 141
See application file for complete search history.

(56) References Cited

U.S. PATENT DOCUMENTS 6,710,835 B2    3/2004   Kurahashi et al.
7,782,435 B2    8/2010   Lim
(Continued)

FOREIGN PATENT DOCUMENTS

CN    101299122    11/2008
JP    2002-221736   8/2002
(Continued)

*Primary Examiner* — Dung Nguyen
(74) *Attorney, Agent, or Firm* — Hamre, Shumann, Mueller & Larson P.C.

(57) ABSTRACT

A gate line (40) has a two-layered structure comprising a lower gate line (40a) made of material identical to a pixel electrode (70), and positioned in the same layer as the pixel electrode (70), and an upper gate line (40b) layered on the lower gate line (40b), and made of material having a higher electrical conductivity than the transparent conductive material. According to this structure, it is possible to reduce the number of times performing exposure processes in manufacturing an in-plane switching type liquid crystal panel.

3 Claims, 27 Drawing Sheets

(51) Int. Cl.
  *G02F 1/1362*  (2006.01)
  *G02F 1/1345*  (2006.01)
  *G02F 1/1368*  (2006.01)

(52) U.S. Cl.
  CPC ............... *G02F2001/136236* (2013.01); *G02F 2001/136295* (2013.01)

(56) References Cited

U.S. PATENT DOCUMENTS

| | | |
|---|---|---|
| 7,898,629 B2 | 3/2011 | Ono et al. |
| 8,411,244 B2 | 4/2013 | Yoo et al. |
| 8,502,932 B2 | 8/2013 | Kang |
| 2002/0101555 A1 | 8/2002 | Kurahashi et al. |
| 2005/0030461 A1 | 2/2005 | Ono et al. |
| 2005/0078260 A1 | 4/2005 | Ono et al. |
| 2005/0078261 A1 | 4/2005 | Ono et al. |
| 2005/0078262 A1 | 4/2005 | Ono et al. |
| 2005/0083470 A1 | 4/2005 | Ono et al. |
| 2005/0083471 A1 | 4/2005 | Ono et al. |
| 2007/0269936 A1 | 11/2007 | Tanaka et al. |
| 2007/0273819 A1 | 11/2007 | Kawasaki et al. |
| 2008/0013028 A1 | 1/2008 | Ono et al. |
| 2008/0062371 A1 | 3/2008 | Ono et al. |
| 2008/0266479 A1 | 10/2008 | Lim |
| 2009/0091697 A1 | 4/2009 | Ono et al. |
| 2009/0096974 A1 | 4/2009 | Ono et al. |
| 2009/0096979 A1 | 4/2009 | Ono et al. |
| 2009/0128764 A1 | 5/2009 | Ono et al. |
| 2009/0135326 A1 | 5/2009 | Ono et al. |
| 2010/0328596 A1 | 12/2010 | Ono et al. |

FOREIGN PATENT DOCUMENTS

| | | |
|---|---|---|
| JP | 2007-310334 | 11/2007 |
| JP | 2007-316321 | 12/2007 |
| JP | 2008-235499 | 10/2008 |
| JP | 2010-060967 | 3/2010 |
| WO | 01/18597 | 3/2001 |

FIG.7
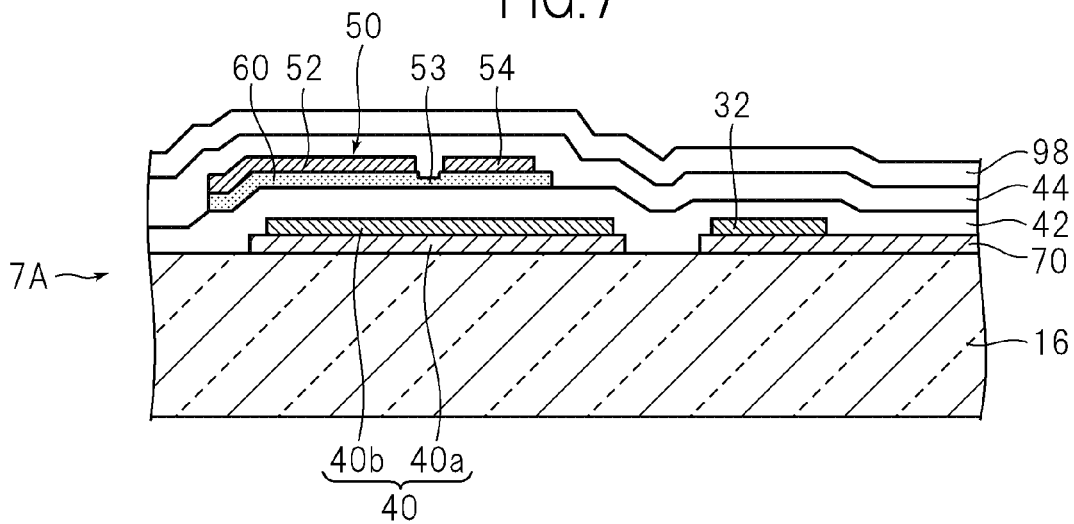
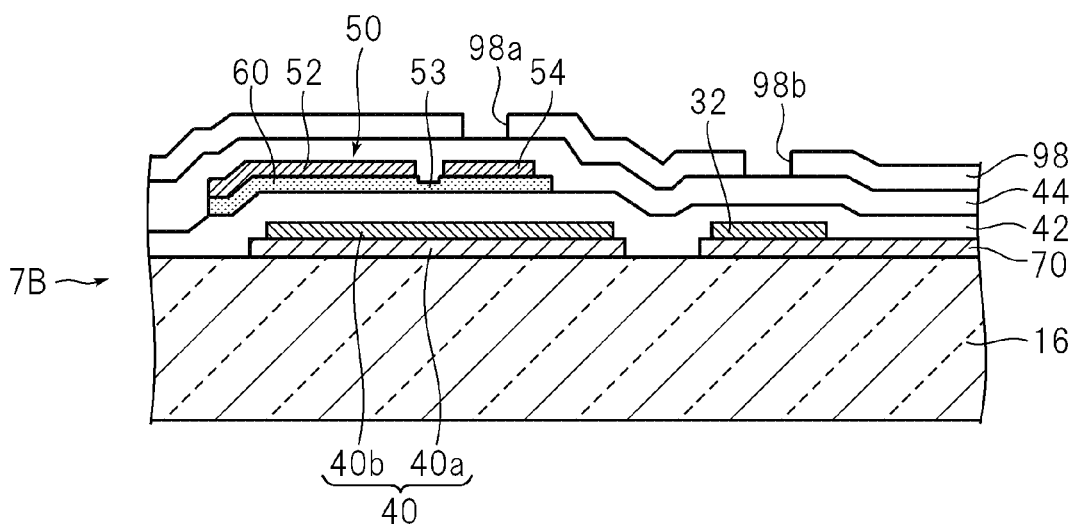
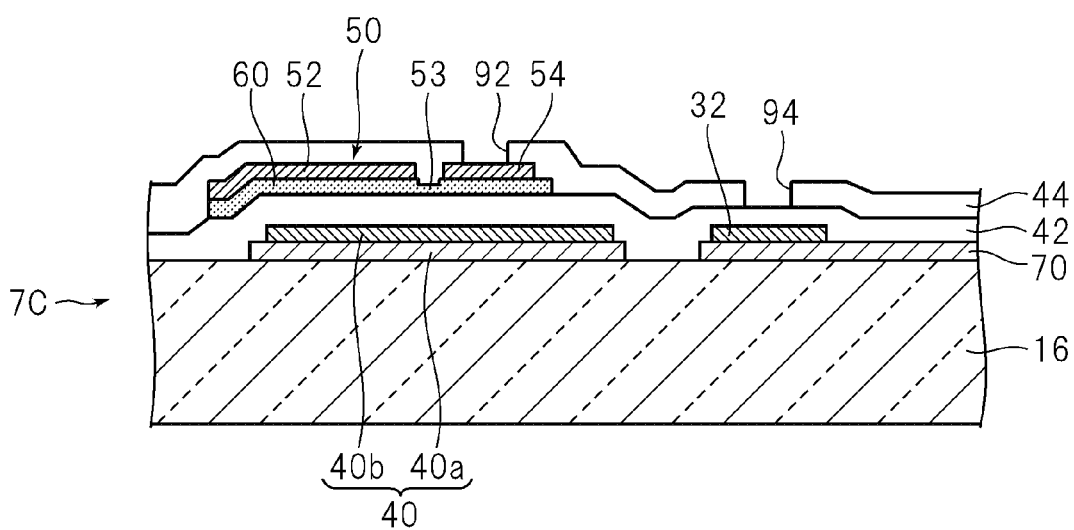

FIG.8
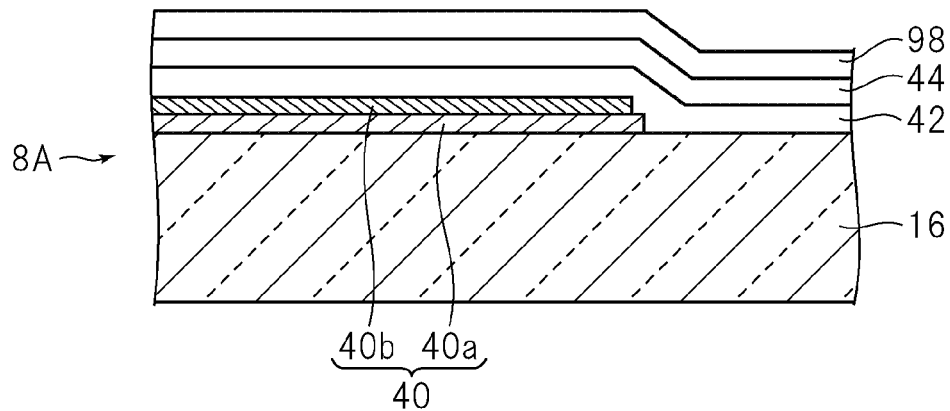
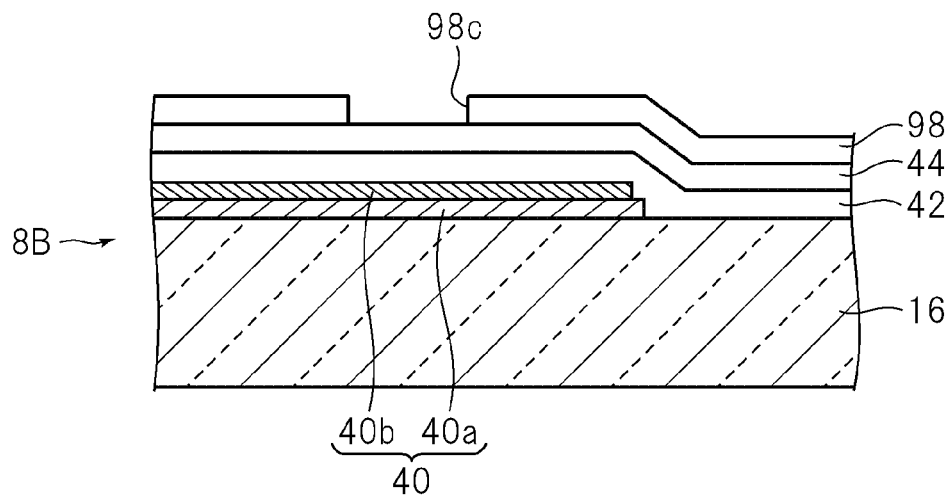
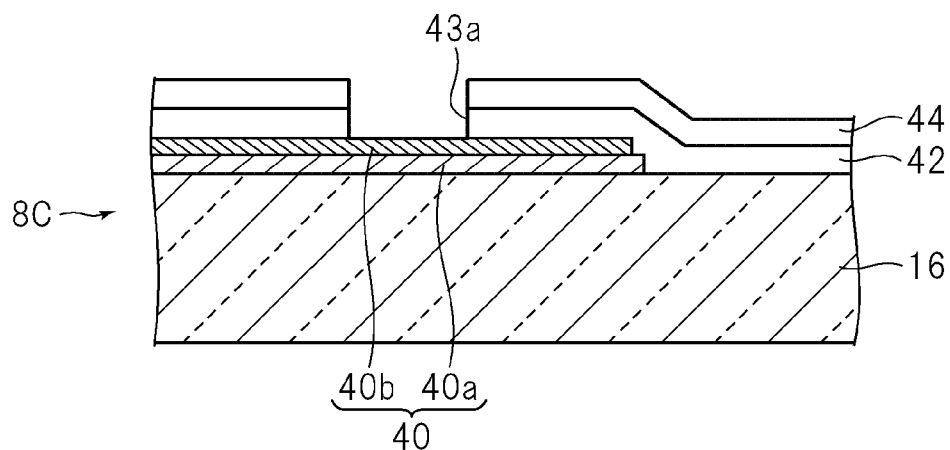

FIG. 9
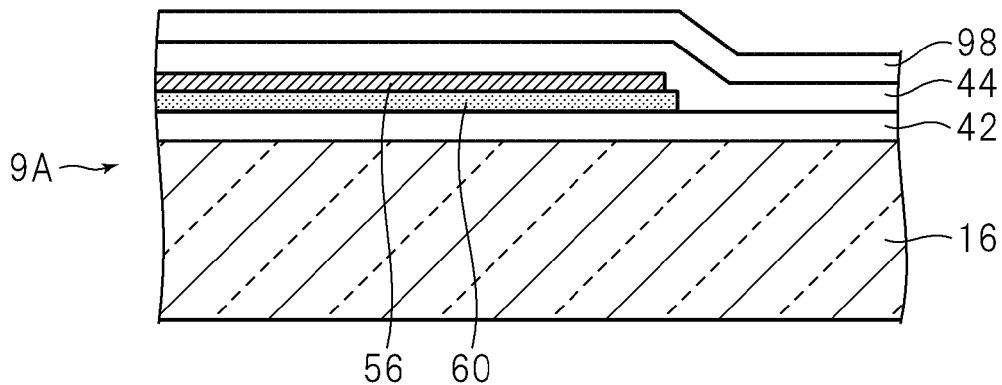
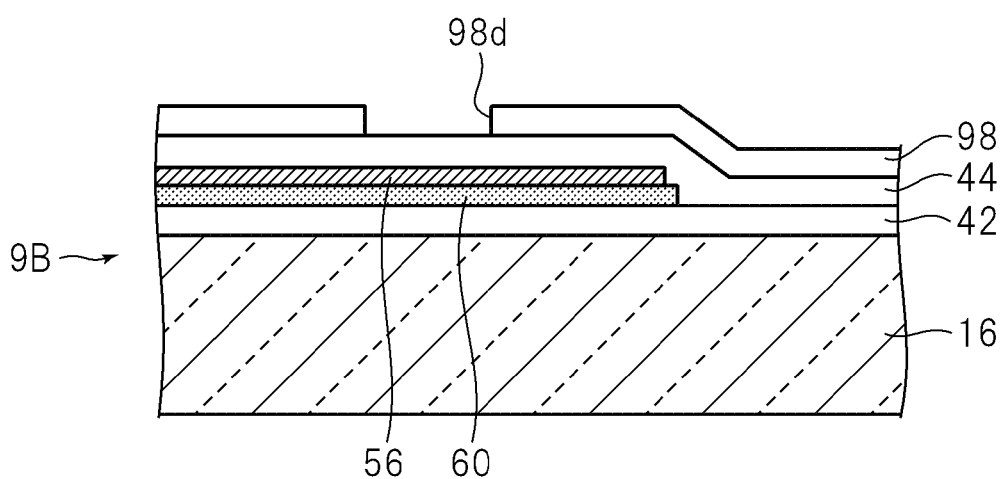
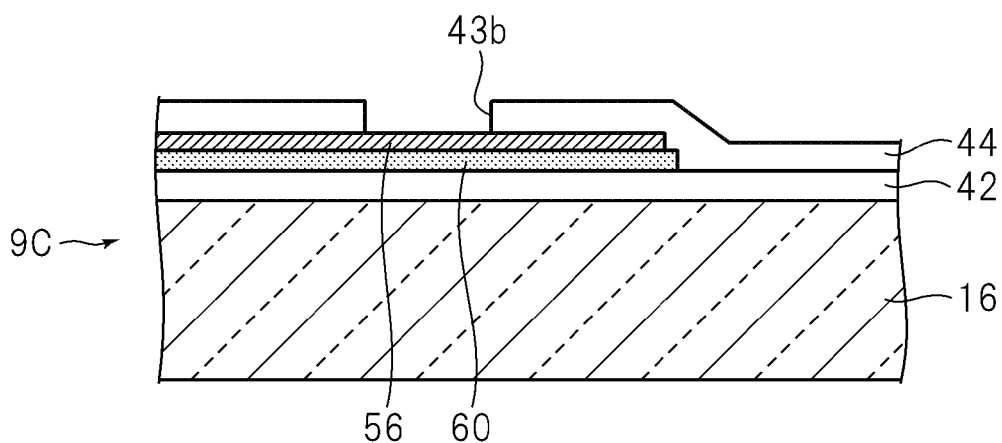

FIG.10
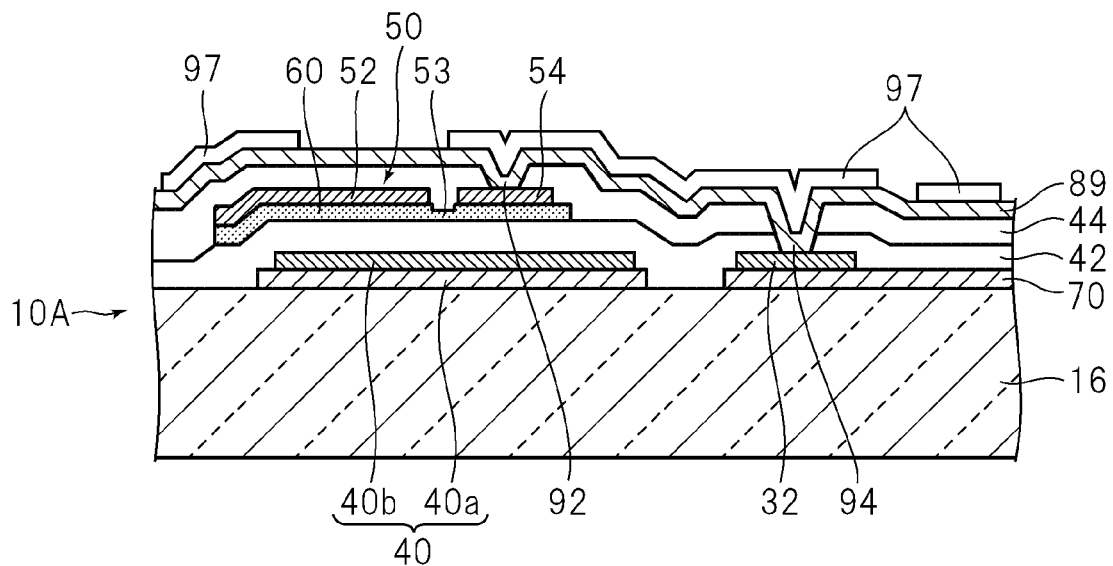
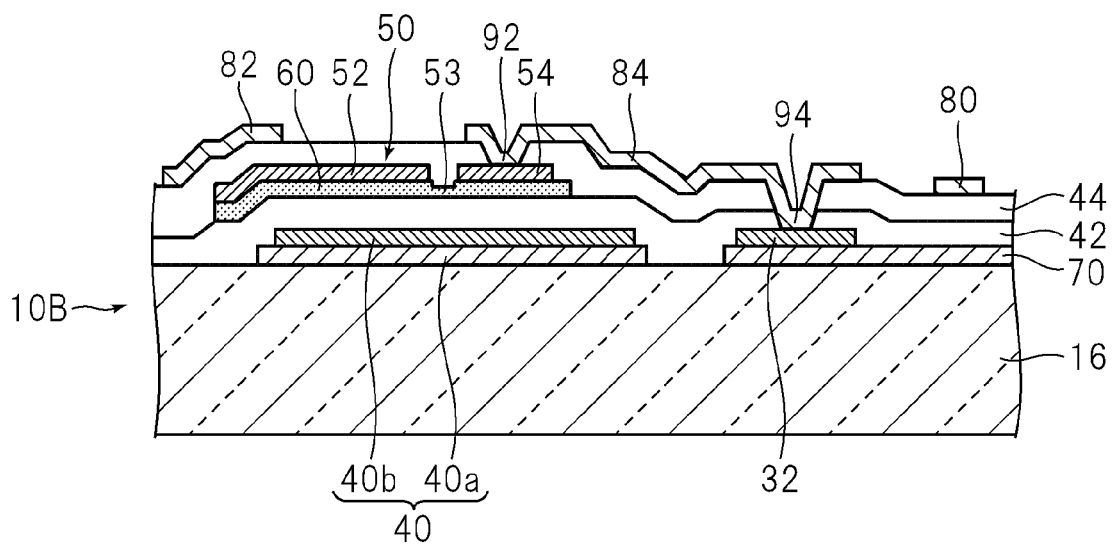

FIG.18A
(a)
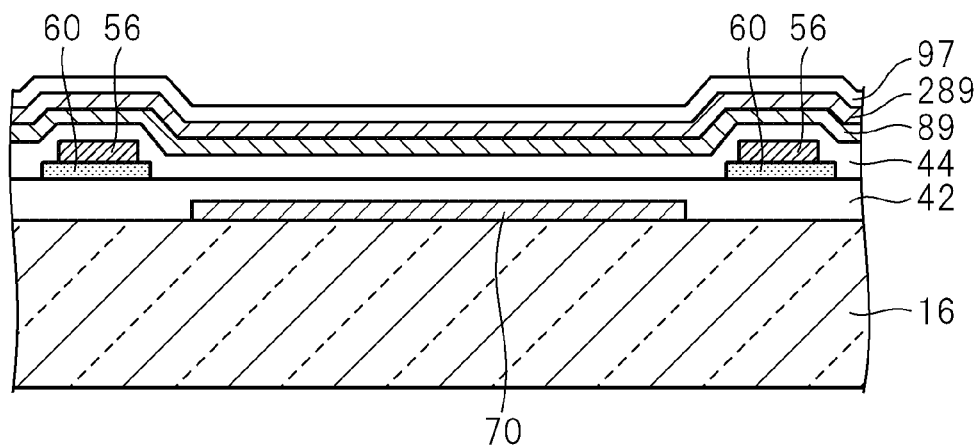
(b)
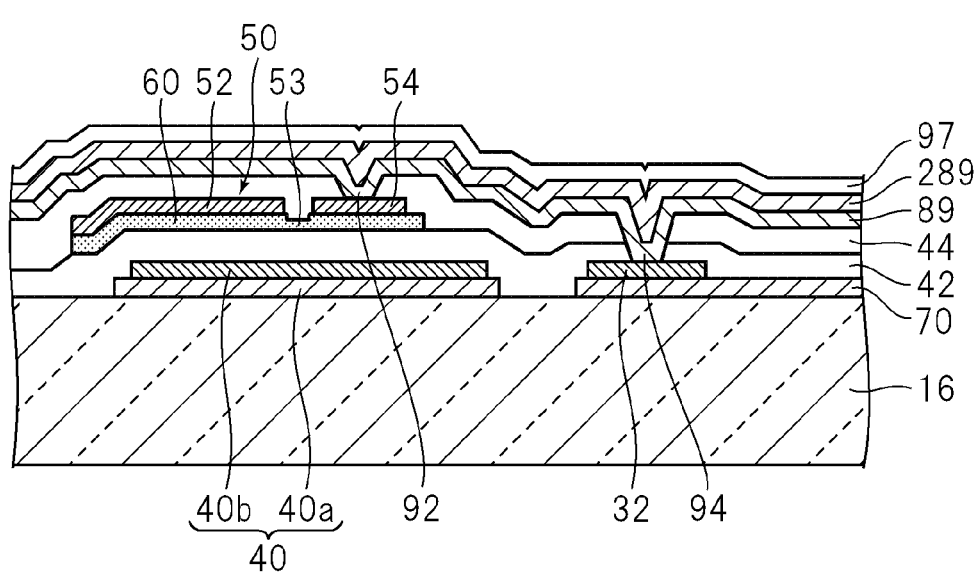

FIG.18B
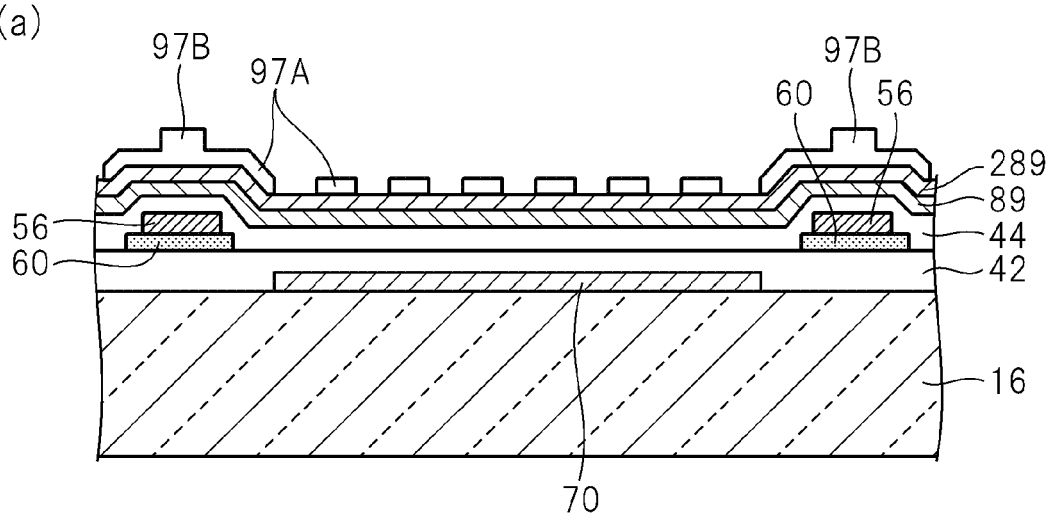
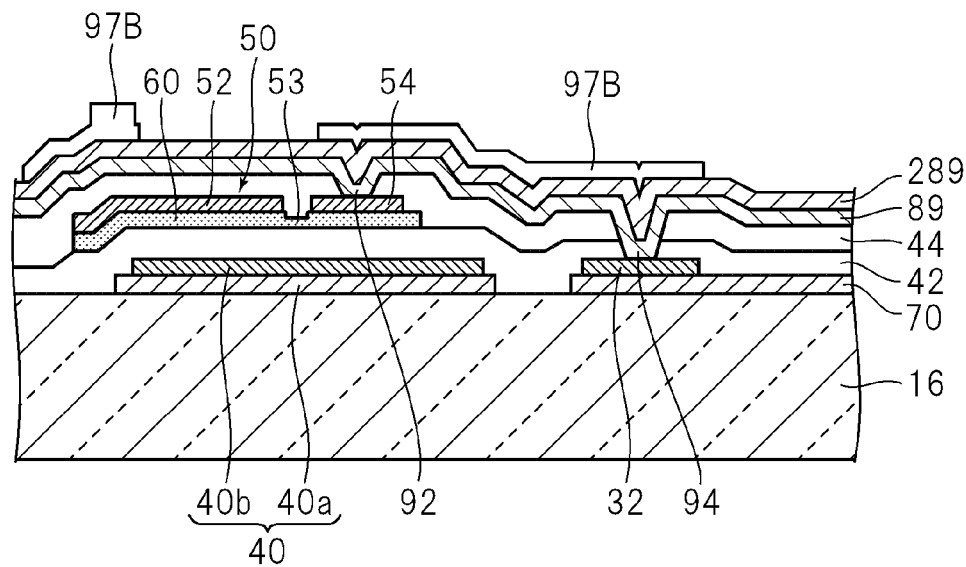

FIG.18C
(a)
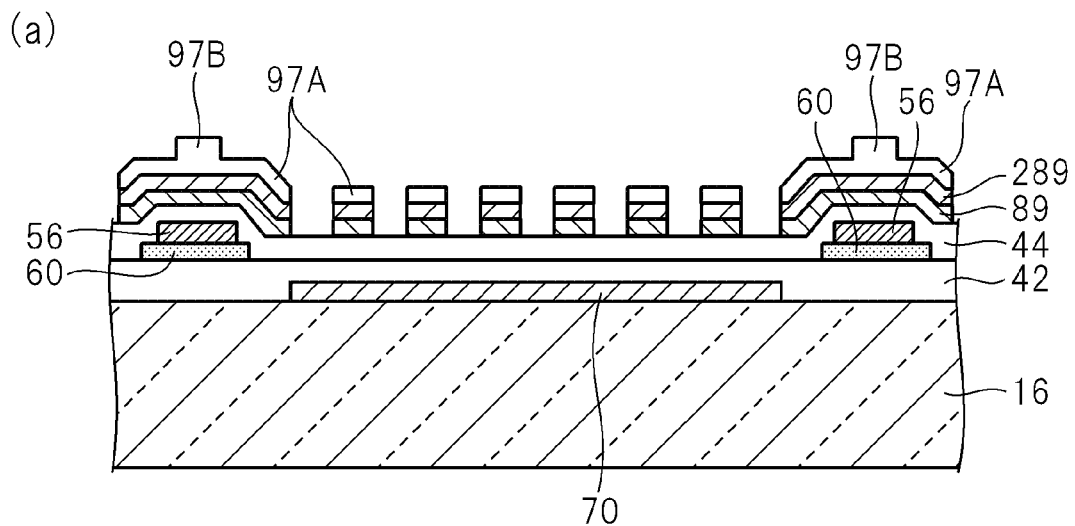
(b)
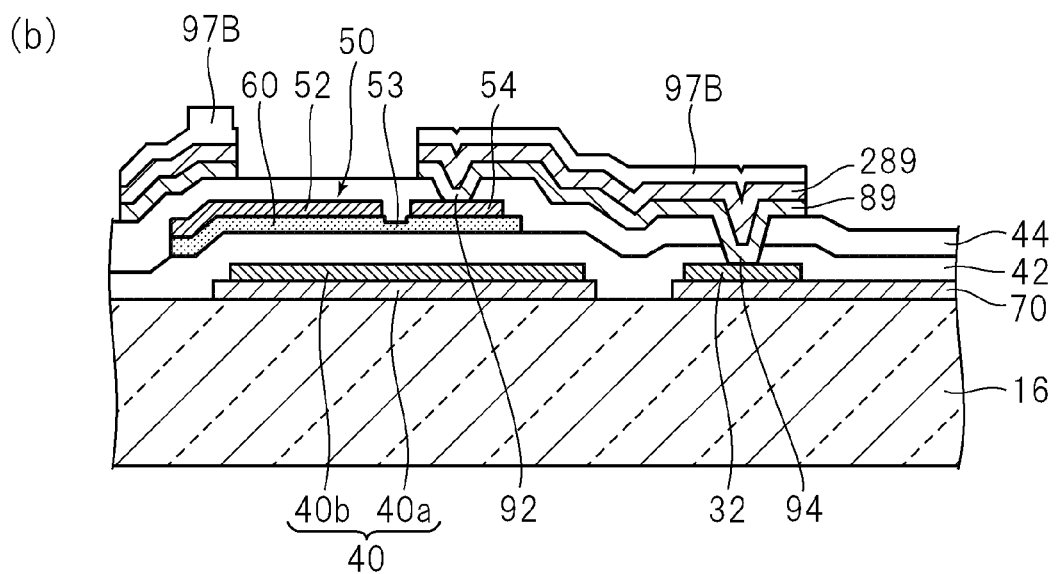

FIG.18D
(a)
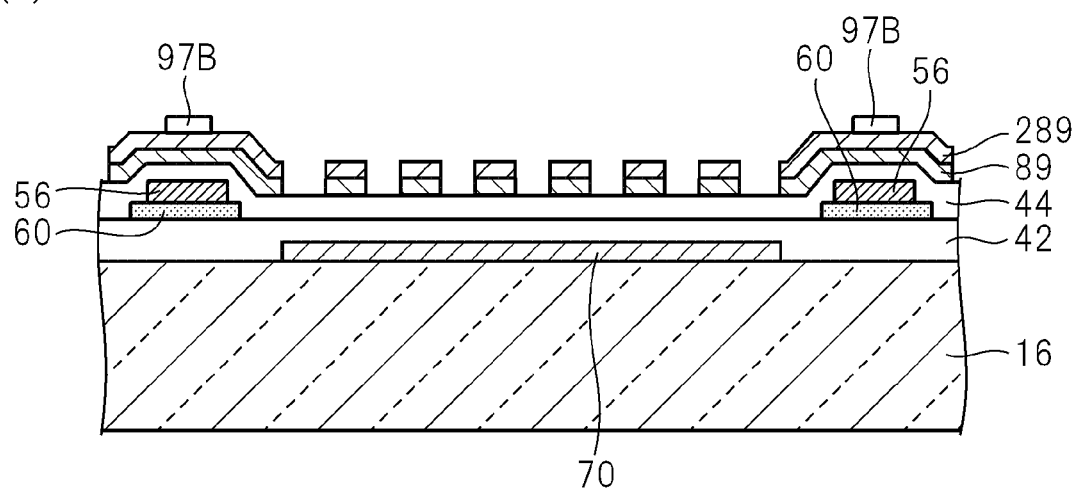
(b)
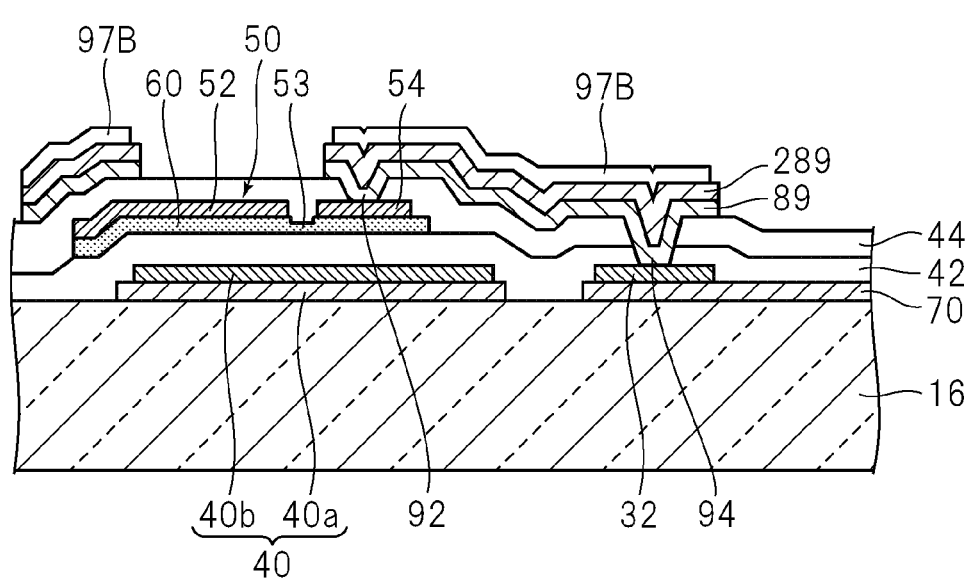

LIQUID CRYSTAL PANEL, LIQUID CRYSTAL DISPLAY DEVICE, AND MANUFACTURING METHOD THEREOF

CROSS-REFERENCE TO RELATED APPLICATION

The present application claims priority from Japanese application JP2010-266443 filed on Nov. 30, 2010, the content of which is hereby incorporated by reference into this application.

BACKGROUND OF THE INVENTION

1. Field of the Invention

The present invention relates to a liquid crystal panel, and in particular, to a technique for reducing the number of times of application of exposure in a process of manufacturing the same.

2. Description of the Related Art

In an in-plane switching liquid crystal panel, a pixel electrode and a common electrode (opposed electrode) are both formed on one substrate where a thin film transistor is formed. As described in International Publication No. WO2001/018597, this kind of liquid crystal panel includes one of a type in which a common electrode is formed in the uppermost layer except an alignment layer film, and other conductor layers, such as a pixel electrode, a signal line, and so forth, are formed in layers lower than the common electrode. In this type, an electric field generated by a voltage applied to a video signal line (drain line) can be shielded by using the common electrode. Consequently, a black matrix for hiding influence of an electric field on displayed image can be reduced in its width and thus an aperture ratio of a pixel can be improved.

A substrate of a liquid crystal panel is generally manufactured using a photolithographic method. In the photolithographic method, a resist film is patterned on an insulating film and a conductor film at exposure processes, and the insulating film or the like is etched using the resist film as a mask.

SUMMARY OF THE INVENTION

Exposure processes are desired fewer in the number of times of performing the process, because the exposure processes cost much due to using an expensive photo mask.

An aspect of the present invention aims to reduce the number of times performing exposure processes in manufacturing of a liquid crystal panel and a liquid crystal display device having a pixel electrode and a common electrode formed on one substrate and a pixel electrode, a signal line, and so forth formed in a layer lower than the common electrode. Another aspect of the present invention aims to provide a manufacturing method thereof.

According to an aspect of a liquid crystal panel includes two substrates sandwiching liquid crystal; a thin film transistor formed on one substrate of the two substrates and having lines connected thereto; a pixel electrode formed on the one substrate and made of a transparent conductive material; and a common electrode formed on the one substrate and made of a transparent conductive material. The pixel electrode, the thin film transistor, and the lines are positioned in a layer lower than the common electrode. A gate line of the lines has a two-layered structure containing a lower line made of material identical to the pixel electrode and positioned in a layer same as the pixel electrode, and an upper line layered on the lower line and made of material having a higher electrical conductivity than the transparent conductive material.

According to another aspect of the present invention, there is provided a liquid crystal display device including the above described liquid crystal panel.

According to the present invention, exposure using a multiple gradation mask can be carried out to a resist film at a process of forming a gate line and a pixel electrode. Consequently, the gate line and the pixel electrode can both be formed at a single exposure process, and therefore the number of exposure processes can be reduced.

In an embodiment of the present invention, the thin film transistor may include an electrode formed above a first insulating film covering the gate line and the pixel electrode; the common electrode may be formed on a second insulating film over the first insulating film; and a connecting conductor may be formed in a layer same as the common electrode and made of material identical to the common electrode, the connecting conductor being connected the electrode of the thin film transistor and the pixel electrode through a contact hole formed in the first insulating film and the second insulating film. According to this embodiment, the connection conductor can be formed without increasing the number of exposure processes. In this embodiment, the electrode of the thin film transistor may include a part positioned above the pixel electrode; the part of the electrode and a part of the pixel electrode may be positioned inside the contact hole; and the connecting conductor may connect the part of the electrode and the part of the pixel electrode together inside the contact hole. As a result, it is possible to make a smaller connecting conductor, and therefore the aperture ratio of a pixel can be improved.

In another embodiment of the present invention, an auxiliary common line may be formed in a layer lower than the common electrode and connected to the common electrode through a contact hole; and the auxiliary common line may have a two-layered structure containing a lower auxiliary line positioned in a layer same as the pixel electrode and the lower line of the gate line and made of material identical to the pixel electrode, and an upper auxiliary line made of material identical to the upper line of the gate line and layered on the lower auxiliary line. In this embodiment, it is possible to reduce the resistance of the common electrode by the auxiliary common line. Further, it is possible to form the auxiliary common line without increasing the number of exposure processes.

In another embodiment of the present invention, the common electrode may have an auxiliary common line formed thereon and made of material having a higher electrical conductivity than the common electrode. In this embodiment, it is possible to reduce the resistance of the common electrode by the auxiliary common line. Further, it is possible to form an auxiliary common line without increasing the number of exposure processes.

In another embodiment of the present invention, a drain line for receiving a video signal may be formed in a layer lower than the common electrode and connected to the thin film transistor, and an auxiliary common line, made of material having a higher electrical conductivity than the common electrode, may be formed in a layer same as the drain line and connected to the common electrode through a contact hole. In this embodiment, it is possible to reduce the resistance of the common electrode.

In this embodiment, the thin film transistor may include a channel formed of a semiconductor layer, and the drain line and the auxiliary common line may have a two-layered structure containing the semiconductor layer and a conductor layer on the semiconductor layer. As a result, exposure using a multiple gradation mask can be carried out to the resist film at a process forming the channel, the drain line, and the auxiliary common line. Consequently, it is possible to form the channel, the drain line, and the auxiliary common line at a single exposure process, and therefore, it is possible to reduce the number of exposure processes.

In another embodiment of the present invention, the common electrode may be formed such that a part of the common electrode is positioned above a drain line connected to the thin film transistor and receiving a video signal. In this embodiment, an electric field generated by the drain line can be shielded by the common electrode.

In this embodiment, a second insulating film and an additional insulating portion may be formed between the part of the common electrode and the drain line, the additional insulating portion being made of material having a lower dielectric constant than the second insulating film. As a result, it is possible to reduce the capacity between the drain line and the common electrode.

In this embodiment, the additional insulating portion may be made of material for a resist film used in an etching process forming the second insulating film. As a result, the additional insulating portion can be formed without increasing the number of exposure processes.

According to another aspect of the present invention, there is provided a method for manufacturing the liquid crystal panel, the method comprising a process of layering a conductor film on a transparent conductive film for forming the pixel electrode, the conductor film having a higher electrical conductivity than the transparent conductive film; a process of forming a resist film on the conductor film; a process of patterning the resist film to form, through exposure using a multiple gradation mask, a first resist film patterned corresponding to the pixel electrode and a second resist film thicker than the first resist film and patterned corresponding to a gate line of the lines, and a process of forming, using the first resist film and the second resist film, the pixel electrode from the transparent conductive film, and the gate line from the transparent conductive film and the conductor film.

According to the present invention, the gate line and the pixel electrode can both be made at a single exposure process, and therefore, it is possible to reduce the number of exposure processes.

In one embodiment, the method may further comprise a process of forming a first insulating film for covering the pixel electrode and the gate line; a process of forming an electrode constituting the thin film transistor above the first insulating film; a process of layering a second insulating film over the first insulating film such that the second insulating film covers the electrode of the thin film transistor; a process of forming a transparent conductive film on the second insulating film; and a process of forming, from the transparent conductive film, a connecting conductor and the common electrode, the connecting conductor being connected to the pixel electrode and the electrode of the thin film transistor through contact holes formed in the first insulating film and the second insulating film. According to this embodiment, it is possible to form a connecting conductor without increasing the number of exposure processes.

In one embodiment, the second resist film may be patterned corresponding to an auxiliary common line to be connected with the common electrode, in addition to the gate line. In this embodiment, it is possible to form an auxiliary common line without increasing the number of exposure processes.

In one embodiment, the method may further comprise a process of layering on a transparent conductive film for forming the common electrode, a conductor film having a higher electrical conductivity than the transparent conductive film; a process of forming a resist film on the conductor film; a process of patterning the resist film to form, through exposure using a multiple gradation mask, a third resist film patterned corresponding to the common electrode, and a fourth resist film thicker than the third resist film and patterned corresponding to an auxiliary common line to be formed on the common electrode; and a process of forming the common electrode from the transparent conductive film, and the auxiliary common line from the conductive film, using the third resist film and the fourth resist film. In this embodiment, it is possible to form an auxiliary common line without increasing the number of exposure processes.

In one embodiment, the method may further comprise a process of layering a conductor film on a semiconductor layer for forming a channel of the thin film transistor; a process of forming a resist film on the conductor film; a process of patterning the resist film to form, through exposure using a multiple gradation mask, a fifth resist film patterned corresponding to the channel, and a sixth resist film thicker than the fifth resist film and patterned corresponding to a drain line connected to the thin film transistor and an auxiliary common line formed along the drain line; and a process of forming the channel from the semiconductor layer, and the drain line and the auxiliary common line from the semiconductor layer and the conductor layer, using the fifth resist film and the sixth resist film. As a result, it is possible to form an auxiliary common line without increasing the number of exposure processes.

In one embodiment, the method may further comprise a process of forming a first insulating film for covering the pixel electrode and the gate line to be connected to the thin film transistor; a process of forming a second insulating film over the first insulating film; a process of forming, on the second insulating film, a resist film having a lower dielectric constant than the second insulating film; a process of patterning the resist film to form, through exposure using a multiple gradation mask, a resist film having a part thicker than other part thereof on the drain line; a process of removing the resist film except the thicker part of the resist film; and a process of forming the common electrode on the thicker part of the resist film and the second insulating film. In this embodiment, it is possible to form an insulating part having a low dielectric constant between the common electrode and the drain line without increasing the number of exposure processes.

BRIEF DESCRIPTION OF THE DRAWINGS

FIG. 7 is a diagram explaining a third exposure process in a manufacturing process of the first substrate;

FIG. 8 is a diagram explaining the third exposure process;

FIG. 9 is a diagram explaining the third exposure process;

FIG. 10 is a diagram explaining a fourth exposure process in a manufacturing process of the first substrate;

FIG. 18A is a diagram showing a manufacturing process of a first substrate according to the third embodiment;

FIG. 18B is a diagram showing a manufacturing process of a first substrate according to the third embodiment;

FIG. 18C is a diagram showing a manufacturing process of a first substrate according to the third embodiment;

FIG. 18D is a diagram showing a manufacturing process of a first substrate according to the third embodiment;

DETAILED DESCRIPTION OF THE INVENTION

Figure 1:
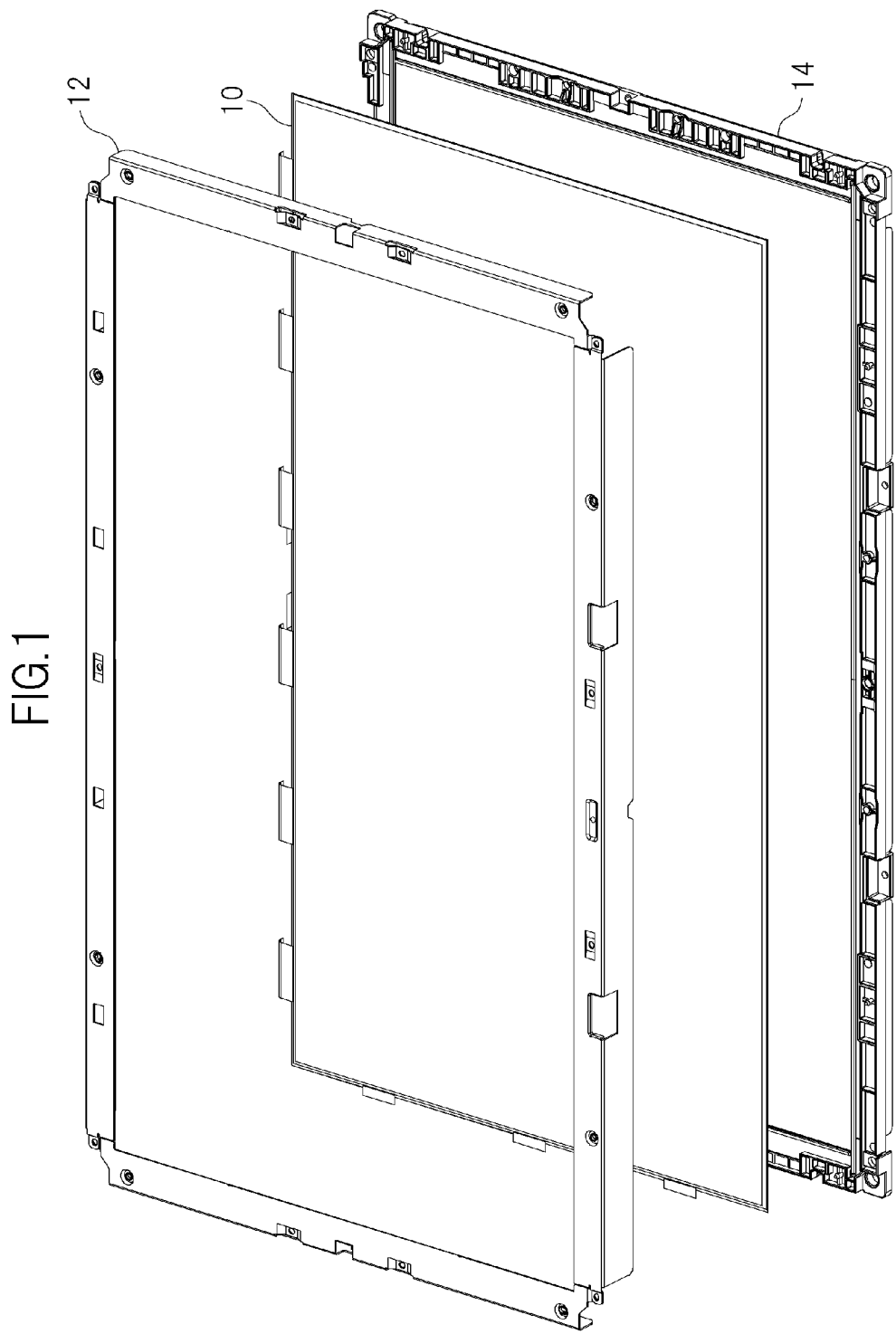
FIG. 1 is an exploded perspective view of a liquid crystal panel according to one embodiment of the present invention.

In the following, one embodiment of the present invention will be described with reference to the accompanying drawings. FIG. 1 is an exploded perspective view of a liquid crystal display device according to an embodiment of the present invention.

As shown in FIG. 1, a liquid crystal display device includes a liquid crystal panel 10. The liquid crystal display device further includes an upper frame 12 and a lower frame 14 that together sandwich the outer circumferential edge of the liquid crystal panel 10. The liquid crystal panel 10 is held by these frames 12, 14. Further, the liquid crystal display device includes a backlight unit (not shown). The backlight unit is placed on the rear side of the liquid crystal panel 10, and irradiates light toward the rear surface of the liquid crystal panel 10.

Figure 2:
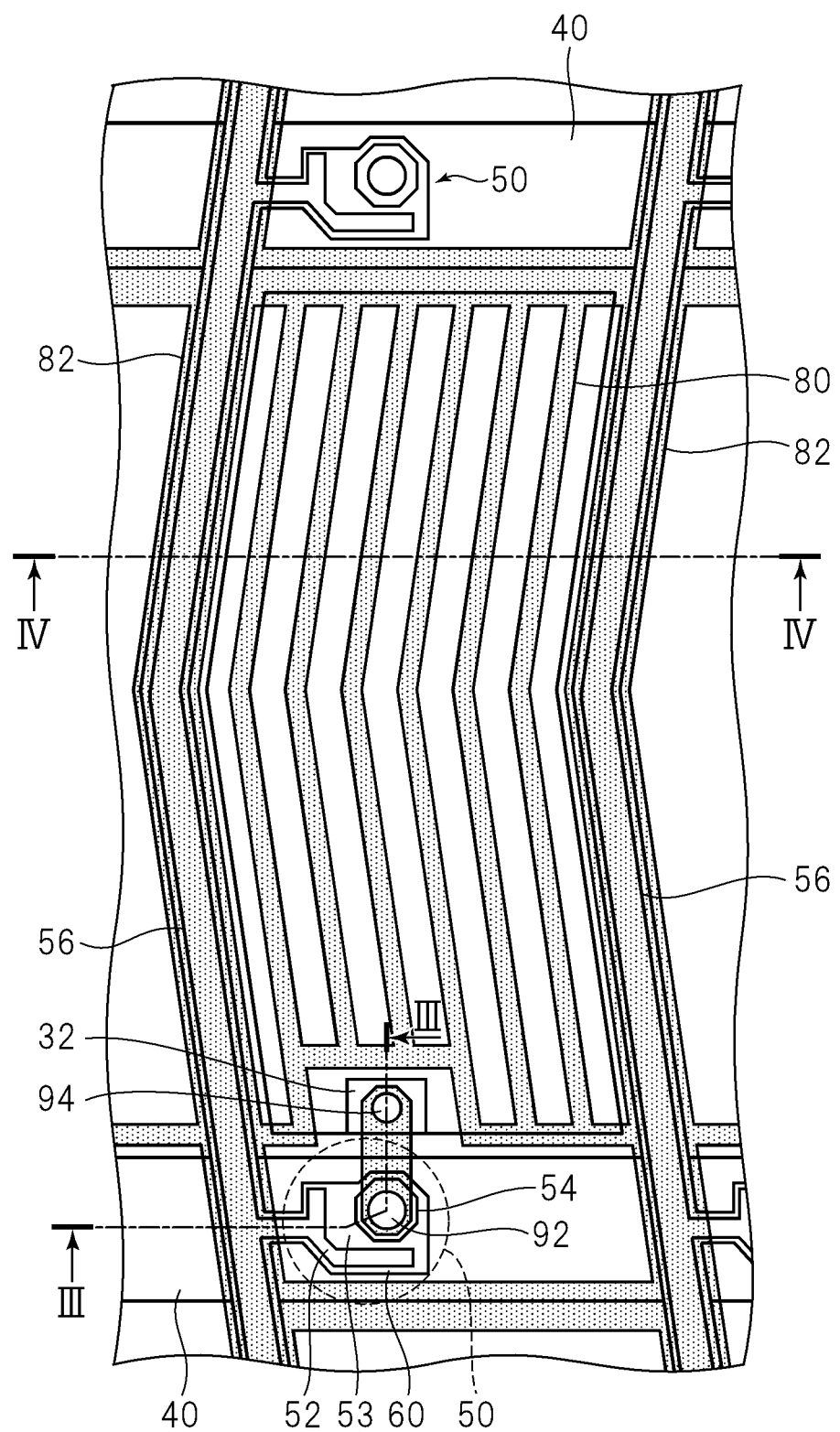
FIG. 2 is a plan view of a pixel formed on one transparent substrate (first substrate) constituting the liquid crystal panel.
Figure 3:
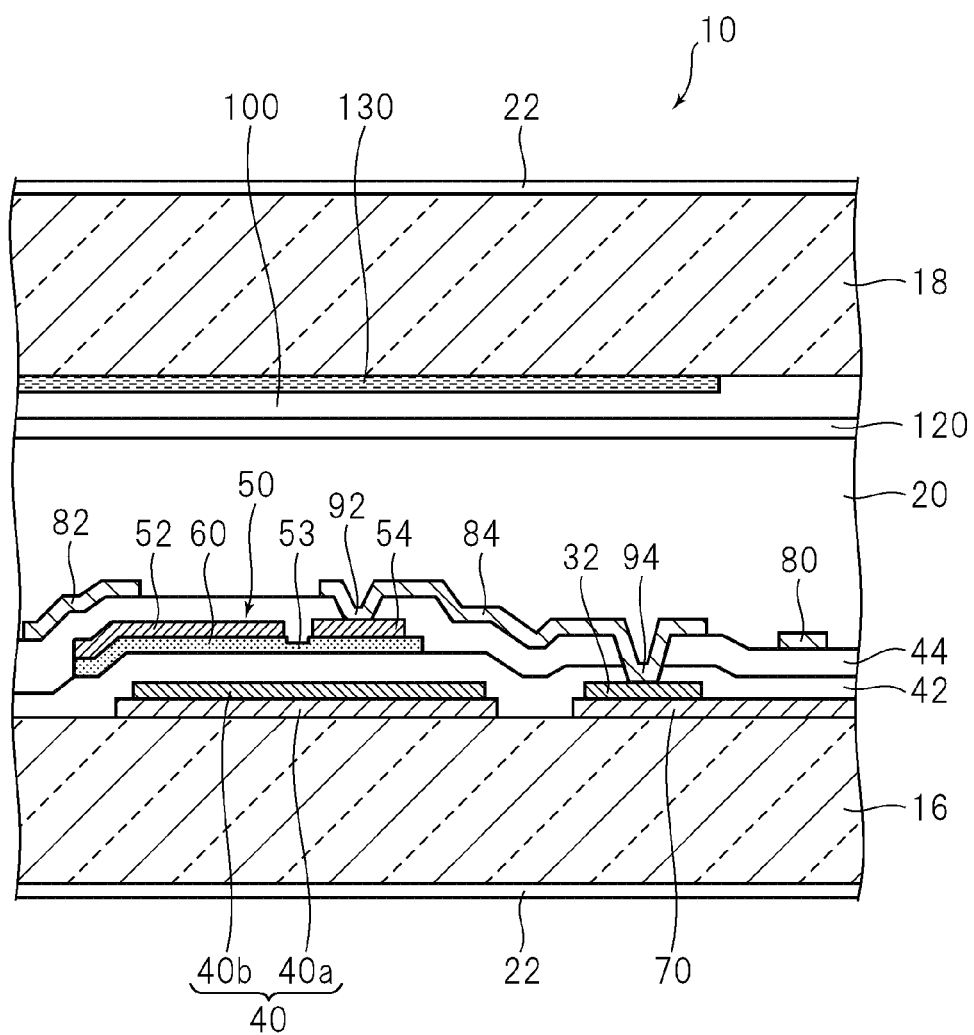
FIG. 3 is a cross sectional view of the liquid crystal panel with a cross section along the line III-III shown in FIG. 2.
Figure 4:
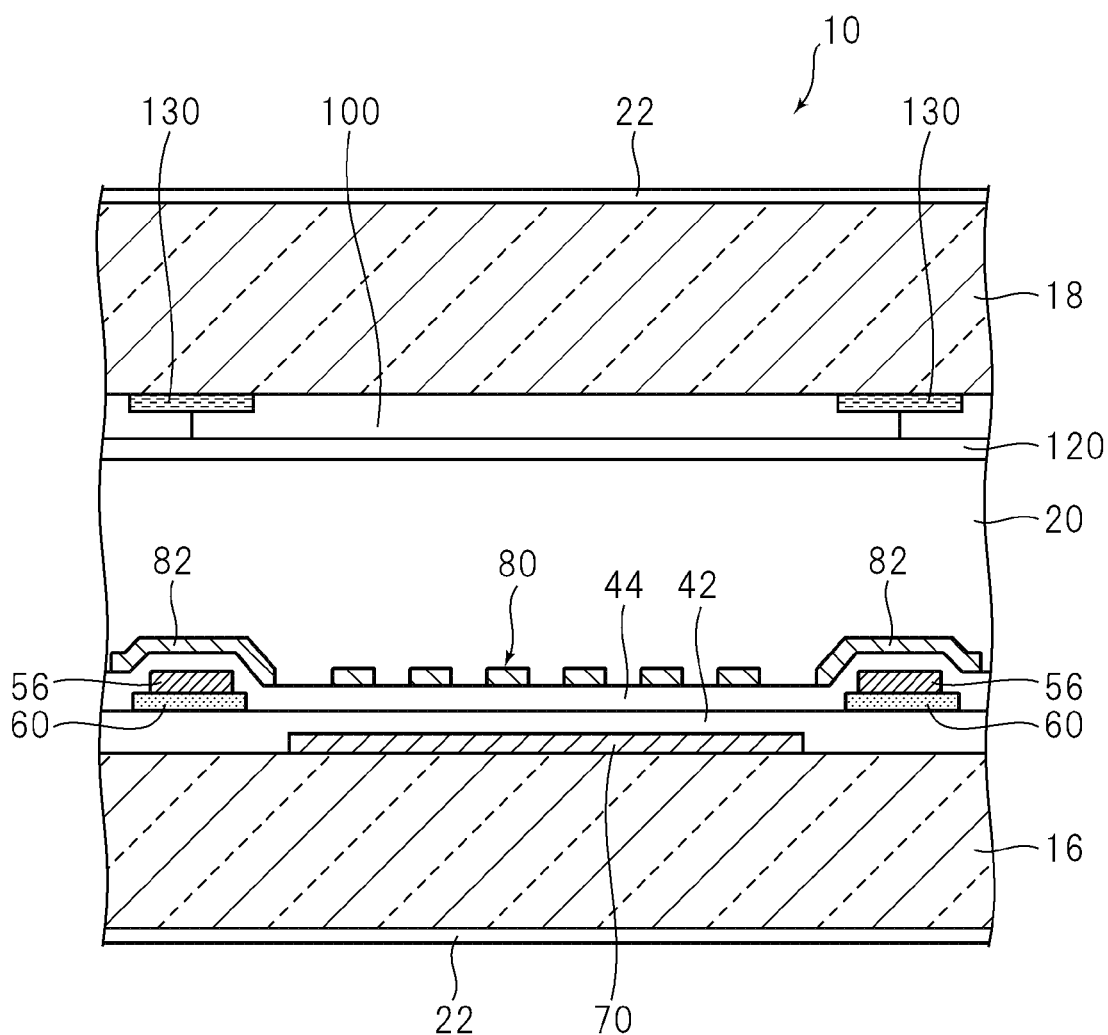
FIG. 4 is a cross sectional view of the liquid crystal panel with a cross section along the line IV-IV shown in FIG. 2.

FIG. 2 is a plan view of a pixel formed on one transparent substrate 16 constituting the liquid crystal panel 10. FIGS. 3 and 4 are cross sectional views of the liquid crystal panel 10. FIG. 3 is a cross sectional view with a cross section along the line III-III shown in FIG. 2, and FIG. 4 is a cross sectional view with a cross section along the line IV-IV shown in FIG. 2.

As shown in FIGS. 3 and 4, the liquid crystal panel 10 has a first substrate 16 and a second substrate 18 opposed to each other. These two substrates are transparent substrates (e.g., a glass substrate). The first substrate 16 and the second substrate 18 sandwich liquid crystal 20. Polarizers 22 in a crossed-Nicols arrangement are respectively attached on the surface of the first substrate 16 opposite from the liquid crystal 20 and on the surface of the second substrate 18 opposite from the liquid crystal 20.

A black matrix 130 is formed on the surface of the second substrate 18 toward the liquid crystal 20. The black matrix 130 is made of a highly light-shielding material such as resin that contains black pigment and carbon, metal chromium, and nickel. The black matrix 130 has a function of preventing light from being irradiated to a channel 53 of a thin film transistor 50 formed on the first substrate 16. Further, in this example described here, as shown in FIG. 4, the black matrix 130 is positioned on a drain line 56 to be described later formed on the first substrate 16, being formed along the drain line 56.

Further, color filters 100 are formed on the surface of the second substrate 18 toward the liquid crystal 20. The color filters 100 are made of colored films in a plurality of colors (e.g., three colors including red, green, and blue).

Further, an overcoat film 120 is formed on the side of the second substrate 18 toward the liquid crystal 20, covering the color filters 100. The surface of the second substrate 18 toward the liquid crystal 20 is protected by the overcoat film 120.

The first substrate 16 will be described. In the description below, the direction in which the first substrate 16 faces the liquid crystal 20 is defined as an upper direction.

As shown in FIGS. 2 and 3, a plurality of thin film transistors (hereinafter referred to as a TFT) 50 functioning as a switch for controlling the liquid crystal 20 are formed on the surface of the first substrate 16 toward the liquid crystal 20 (the upper surface). The TFT 50 includes a channel 53 formed of a semiconductor layer of amorphous silicon, microcrystal silicon, and so forth, a drain electrode 52, and a source electrode 54. The drain electrode 52 and the source electrode 54 are respectively positioned on the opposite sides to each other across the channel 53. In this embodiment, one electrode, of the two electrodes 52, 54, connected to a pixel electrode 70 is refereed as the source electrode 54, and the other electrode 52 is referred as a drain electrode.

As shown in FIG. 2, a plurality of gate lines 40 connected to the respective TFT's 50 are formed on the first substrate 16. In this example, the drain lines 52, the source electrodes 54, and the channels 53 are positioned above the gate line 40. Therefore, the gate line 40 includes parts functions as a gate electrode of the TFT 50. A scan signal (a gate voltage) for turning on/off the TFT 50 is applied to the gate line 40.

As shown in FIG. 4, a plurality of drain lines 56 connected to the drain electrodes 52 are formed on the first substrate 16. A video signal (a voltage signal indicating a grayscale value of each pixel) is applied to the drain line 56. The plurality of gate lines 40 and the plurality of drain lines 56 are arranged in matrix. That is, the plurality of gate lines 40 are formed substantially perpendicular to the respective drain lines 56. An area surrounded by two adjacent gate lines 40 and two adjacent drain lines 56 constitutes a single pixel, and each pixel is provided with a TFT 50.

The liquid crystal panel 10 drives the liquid crystal 20 in an in-plane switching mode (that is, IPS mode), and thus the pixel electrode 70 and a common electrode 80 opposed to the pixel electrode 70 are both formed on the first substrate 16. The pixel electrode and the common electrode 80 are both made of transparent conductive material (e.g., indium tin oxide (ITO) or indium zinc oxide).

A video signal is applied via the drain line 56 and the TFT 50 to the pixel electrode 70. The pixel electrode 70 has a substantially rectangular shape in a plan view, and a size corresponding to a single pixel.

As shown in FIG. 2, the common electrode 80 includes a common line 82. In the example described here, as shown in FIG. 4, the common line 82 is positioned above and formed along the drain line 56. The common line 82 connects parts of the common electrode 80 that are opposed to the pixel electrode 70 together. With the above, the substantially same potential is resulted throughout the whole common electrode 80.

A plurality of slits are formed on a part of the common electrode 80 that is opposed to the pixel electrode 70. Specifically, in the example shown in FIG. 2, each slit is long in the direction along the drain line 56. Further, each slit is bent midway thereof, and therefore a part thereof on one side (the upper side in FIG. 2) and a part of the other side (the lower side in FIG. 2) across the midway part are difference from each other in angle relative to a rubbing direction.

The pixel electrode 70, the TFT 50, and lines connected to the TFT 50 (specifically, the gate line 40 and the drain line 56) are positioned in a lower layer (a layer closer to the first substrate 16) than the common electrode 80. In the example described here, as shown in FIG. 3, the common electrode 80 is formed in the uppermost layer (a layer closest to the liquid crystal 20) except an alignment film (not shown) for aligning liquid crystal 20.

As shown in FIG. 3, the gate line 40 has a two-layered structure. That is, the gate line 40 has a lower gate line 40a and an upper gate line 40b. The lower gate line 40a is made of transparent conductive material identical to the pixel electrode 70, and positioned in the same layer as the pixel electrode 70. That is, the pixel electrode 70 and the lower gate line 40a are both positioned on the first substrate 16. The upper gate line 40b is layered on the lower gate line 40a. The lower gate line 40a is patterned into a shape corresponding to the upper gate line 40b. The whole upper gate line 40b is positioned on the lower gate line 40a, being in contact with the lower gate line 40a. Such a two-layered structure of the gate line 40 enables a manufacturing method to be described later.

The upper gate line 40b is made of material different from the lower gate line 40a and the pixel electrode 70. Specifically, the upper gate line 40b is made of metal having a higher electrical conductivity than the transparent conductive material of which the pixel electrode 70 or the like is made. For example, the gate line 40b is made of copper, molybdenum, aluminum, or the like. This enables a smaller resistance of the gate line 40 as a whole.

As shown in FIG. 3, a gate insulating film 42 is formed on and covering the upper side of the gate line 40 and the pixel electrode 70. The gate insulating film 42 is made of inorganic material such as semiconductor oxide (oxide silicon ($SiO_2$)), nitride semiconductor (silicon nitride ($SiN_x$)) or the like.

As shown in FIG. 3, the channel 53, the source electrode 54, and the drain electrode 52 of the TFT 50 are formed above the gate insulating film 42. In this example, the channel 53 or the like is formed on the gate insulating film 42.

As shown in FIG. 4, the drain line 56 connected to the drain electrode 52 is formed above the gate insulating film 42. In the above, the drain line 56 is positioned in the same layer as the electrodes 52, 54, being formed on the gate insulating film 42.

As shown in FIGS. 3 and 4, the source electrode 54, the drain electrode 52, and the drain line 56 have a two-layered structure including a semiconductor layer 60 for forming the channel 53 and a conductor layer layered on the semiconductor layer 60 (e.g., a metal layer such as copper, molybdenum, aluminum, and so forth). That is, the semiconductor layer 60 is patterned into a shape corresponding to the source electrode 54, the drain electrode 52, and the drain line 56. Then, the whole conductor layer forming the source electrode 54, the drain electrode 52, and the drain line 56 is positioned on and in contact with the semiconductor layer 60.

As shown in FIGS. 3 and 4, a protective insulating film 44 is formed on and covering the upper side of the channel 53, the source electrode 54, the drain electrode 52, and the drain line 56. The protective insulating film 44 is made of inorganic material such as semiconductor oxide (oxide silicon ($SiO_2$)), nitride semiconductor (silicon nitride ($SiN_x$)), and so forth. The protective insulating film 44 prevents humidity contamination of the semiconductor layer 60.

As shown in FIG. 4, the common electrode 80 is formed on the protective insulating film 44. The common electrode 80 is formed such that apart thereof is positioned above the drain line 56 (that is, the part covers the drain line 56). In this example, the common electrode 80 includes the common line 82. The common line 82 is positioned above the drain line 56 and thus overlaps the drain line 56 in a plan view. The common line 82 is wider than the drain line 56. As described above, a video signal according to a grayscale value of each pixel is applied to the drain line 56. The common line 82 has a function of shielding a noise of electric field due to change of the video signal. Consequently, it is possible to make smaller the width of the black matrix for preventing light transmission due to the noise of electric field.

As shown in FIG. 3, a connecting conductor 84 (a connecting line) for connecting the source electrode 54 and the pixel electrode 70 is formed in the same layer as the common electrode 80. In this example, the connecting conductor 84 is formed on the protective insulating film 44, and is connected to the pixel electrode 70 and the source electrode 54 through contact holes 94, 92, respectively. The contact hole 92 is formed above the source electrode 54 and penetrates the protective insulating film 44. The contact hole 94 is formed above the pixel electrode 70 and penetrates the gate insulating film 42 and the protective insulating film 44. The two contact holes 92, 94 are positioned apart from each other. The connecting conductor 84 is bridged between the contact holes 92, 94, being connected to the pixel electrode 70 and the source electrode 54 through the contact holes 94, 92, respectively. Consequently, the source electrode 54 is electrically connected to the pixel electrode 70. The connecting conductor 84 is made of transparent conductive material identical to the common electrode 80.

As shown in FIG. 2 or FIG. 3, a connecting pad 32 is formed on the pixel electrode 70. The connecting pad 32 is positioned at the lower end of the contact hole 94, and in contact with the pixel electrode 70. Thus, the connecting conductor 84 is connected to the pixel electrode 70 through the contact hole 94 and the connecting pad 32. The connecting pad 32 is made of material having a higher electrical conductivity than the transparent conductive material of which the pixel electrode 70 and the lower gate line 40a are made. In this example, the connecting pad 32 is made of material identical to the upper gate line 40b (that is, metal such as copper or molybdenum). With the above, electric connection between the lower end of the contact hole 94 and the pixel electrode 70 becomes more stabilized. Further, the connecting pad 32 is positioned in the same layer as the upper gate line 40b. Therefore, the connecting pad 32 can be formed at the same process as the upper gate line 40b, as to be described later. Incidentally, the connecting pad 32 is slightly larger in size than the contact hole 94.

Figure 5:
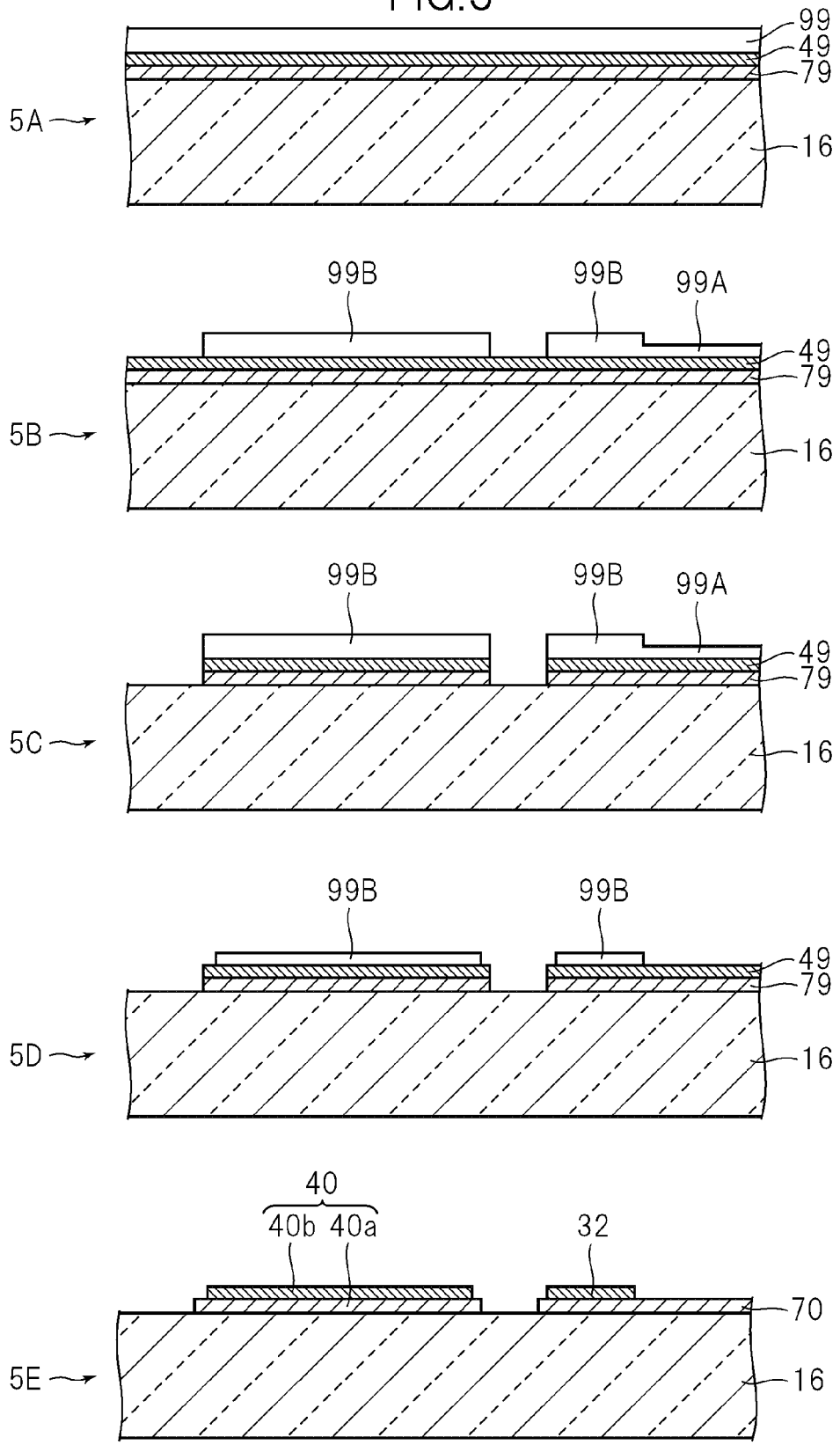
FIG. 5 is a diagram explaining a first exposure process in a manufacturing process of the first substrate.
Figure 6:
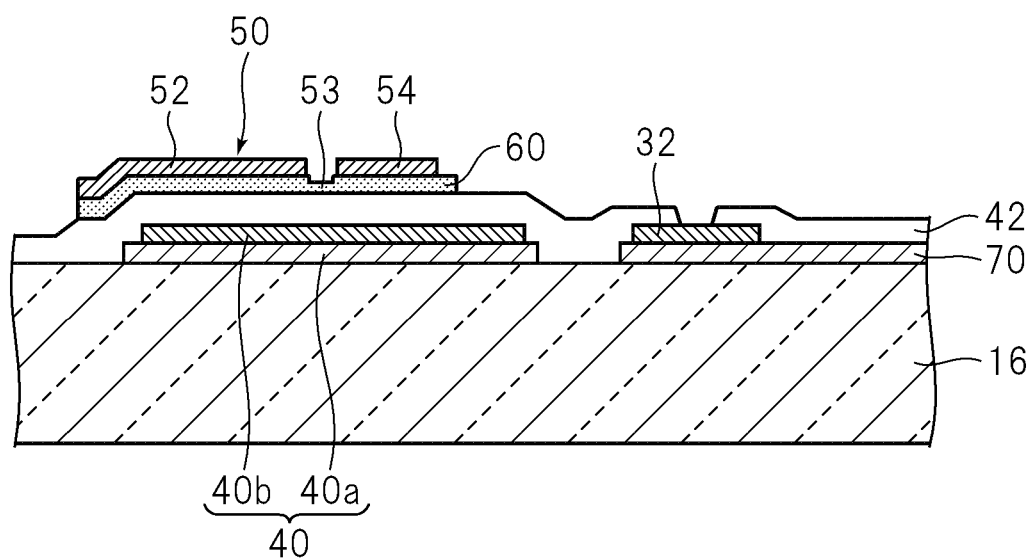
FIG. 6 is a diagram explaining a second exposure process in a manufacturing process of the first substrate.

A manufacturing method of the first substrate 16 will be described. FIGS. 5 to 10 are diagrams showing a manufacturing process of the first substrate 16. In this embodiment, the first substrate 16 is manufactured through four exposure processes. FIG. 5 is a diagram explaining a first exposure process; FIG. 6 is a diagram explaining a second exposure process; FIGS. 7 to 9 are diagrams explaining a third exposure process; and FIG. 10 is a diagram explaining a fourth exposure process.

As shown in 5A in FIG. 5, initially, a transparent conductive film (e.g., a film such as indium tin oxide or indium zinc oxide) 79 for forming the pixel electrode 70 and a conductor film 49 for forming the upper gate line 40b and the connecting pad 32 are layered on the first substrate 16. For example, the transparent conductive film 79 is formed on the first substrate 16 by means of spattering or vacuum evaporation, and the conductor film 49 (a metal film such as e.g., copper, molybdenum, aluminum, and so forth) having a higher electrical conductivity than the transparent conductive film 79 is formed on the transparent conductive film 79. Thereafter, a resist film 99 is formed on the conductor film 49.

Thereafter, as shown in 5B, the resist film 99 is patterned through an exposure process using a photo mask and a development process, and thereby resist films 99A, 99B are formed on the conductor film 49. In the above exposure process, a multiple gradation mask having three levels of light transmissivity, such as a half-tone mask, a gray tone mask, is used as the photo mask, and thereby two resist films having different thickness are formed. Specifically, a thin resist film 99A having a pattern corresponding to the pixel electrode 70 and a thick resist film 99B, thicker than the thin resist film 99A, corresponding to the gate line 40 and the connecting pad 32 are formed.

Thereafter, the pixel electrode 70 is formed using the thin resist film 99A, and the gate line 40 and the connecting pad 32 are formed using the thick resist film 99B. Specifically, initially, the conductor film 49 and the transparent conductive film 79 are etched using both of the thin resist film 99A and the thick resist film 99B as a mask. Consequently, as shown in 5C in FIG. 5, the conductor film 49 and the transparent conductive film 79 are removed in the absence area of the thin resist film 99A and the thick resist film 99B. Thereafter, as shown in 5D, the thin resist film 99A is removed. At the time of removing the thin resist film 99A, the thick resist film 99B, being thicker than the thin resist film 99A, is left having become thinner. Thereafter, the conductor film 49 is etched using the residual thick resist film 99B as a mask, and the thick resist film 99B is then completely removed. Consequently, as shown in 5E in FIG. 5, the above described gate line 40, the connecting pad 32, and the pixel electrode 70 are formed. That is, the pixel electrode 70 and the lower gate line 40a are made from the transparent conductive film 79, and the upper gate line 40b and the connecting pad 32 are made from the conductor film 49.

Thereafter, as shown in FIG. 6, the gate insulating film 42 is formed on and covering the gate line 40, the pixel electrode 70, and the connecting pad 32. The gate insulating film 42 is formed using, e.g., plasma enhanced chemical vapor deposition.

Thereafter, the channel 53, the source electrode 54, and the drain electrode 52 of the TFT 50, and the drain line 56 are formed on the gate insulating film 42. In this embodiment, a multiple gradation mask is used so that those are formed in one exposure process.

Specifically, the semiconductor layer 60, an Ohmic layer (not shown), and a conductor film for forming the source electrode 54, and so forth, are layered on the gate insulating film 42 by means of plasma enhanced chemical vapor deposition or sputtering. Thereafter, a resist film is formed on the conductor film. Then, similar to the method shown in 5C in FIG. 5, the resist film is patterned utilizing a multiple gradation mask. That is, a thin resist film corresponding to a channel and a thick resist film corresponding to the source electrode 54, the drain electrode 52, and the drain line 56 are formed on the conductor film. Then, using the two resist patterns having different thickness, the channel 53, the source electrode 54, the drain electrode 52, and the drain line 56 are formed.

Thereafter, as shown in 7A in FIG. 7, the protective insulating film 44 is formed on the gate insulating film 42, covering the TFT 50. Thereafter, a resist film 98 is layered on the protective insulating film 44. For forming the protective insulating film 44, e.g., plasma enhanced chemical vapor deposition can be employed, similar to forming the gate insulating film 42.

Thereafter, as shown in 7B and 7C, the contact hole 92 penetrating the protective insulating film 44 and the contact hole 94 penetrating the gate insulating film 42 and the protective insulating film 44 are formed. Specifically, the resist film 98 is patterned through an exposure process and a development process. That is, a pattern (holes 98a, 98b) corresponding to the contact holes 92, 94 are formed on the resist film 98 (see 7B). Thereafter, using the thus patterned resist film 98 as a mask, the protective insulating film 44 and the gate insulating film 42 are etched, and thereafter, the resist film 98 is removed. With the above, the contact holes 92, 94 are resulted (see 7C).

A terminal of the gate line 40 and a terminal of the drain line 56 are positioned on the outer circumferential part of the first substrate 16. On the outer circumferential part of the first substrate 16, an opening is formed on the gate insulating film 42 and the protective insulating film 44, and the terminal of the gate line 40 is connected through the opening to a driving circuit for applying a scan signal to the gate line 40. Further, the terminal of the drain line 56 is connected through the opening to a driving circuit for applying a video signal to the drain line 56. The opening for connection between the terminal of the gate line 40 and the driving circuit and the opening for connection between the terminal of the drain line 56 and the driving circuit are formed at the same time as the contact holes 92, 94 shown in FIG. 7.

FIG. 8 is a cross sectional view of a terminal of the gate line 40. The cross sections shown in 8A, 8B, and 8C in FIG. 8 correspond to the respective processes shown in 7A, 7B, and C7 in FIG. 7. FIG. 9 is a cross sectional view of a terminal of the drain line 56. The cross sections shown in 9A, 9B, and 9C in FIG. 9 correspond to the respective processes shown in 7A, 7B, and 7C in FIG. 7.

As shown in 8A in FIG. 8, the gate insulating film 42, the protective insulating film 44, and the resist film 98 are layered on a terminal of the gate line 40. As shown in 9A in FIG. 9, the drain line 56 is formed on the gate insulating film 42, and a terminal of the drain line 56 is covered by the protective insulating film 44 and the resist film 98.

Thereafter, as shown in 8B in FIGS. 8 and 9B in FIG. 9, the resist film 98 is patterned through the exposure process and the development process. That is, openings 98c, 98d of the resist film 98 are formed on the terminal of the gate line 40 and the terminal of the drain line 56, respectively. Then, using the patterned resist film 98 as a mask, the protective insulating film 44 and the gate insulating film 42 are etched. Consequently, as shown in 8C and 9C, the openings 43a, 43b are formed on the respective terminals of the gate line 40 and of the drain line 56. These terminals are connected to the respective driving circuits through the respective openings 43a, 43b. Specifically, a transparent conductive film for forming the common electrode 80 is supplied also to the openings 43a, 43b at a process described later. Consequently, the terminals of the respective lines 40, 56 are connected to the respective driving circuits via the transparent conductive film supplied to these respective openings 43a, 43b.

After the protective insulating film 44 and the gate insulating film 42 are etched in the process shown in FIG. 7, FIG. 8 and FIG. 9, the common electrode 80 and the connecting conductor 84 are formed on the protective insulating film 44. Specifically, as shown in 10A in FIG. 10, a transparent conductive film 89 is formed on the protective insulating film 44. The formation of the transparent conductive film 89 is carried out using, e.g., spattering. Thereafter, a resist film 97 is formed on the transparent conductive film 89, and then patterned through an exposure process and a development process. That is, the resist film 97 is formed into a pattern corresponding to the common electrode 80 and the connecting conductor 84. Thereafter, using the patterned resist film 97 as a mask, the transparent conductive film 89 is etched. Consequently, as shown in 10B, the common electrode 80 and the connecting conductor 84 are formed on the protective insulating film 44. Note that, in this process, a transparent conductive film is supplied also to the openings 43a, 43b described above, and after etching or the like, the transparent conductive film is left only in the openings 43a, 43b. The above described is an example of a manufacturing method of the first substrate 16.

In the above described liquid crystal panel 10, the gate line 40 is made of material identical to the pixel electrode 70 and has a two-layered structure containing the lower gate line 40a positioned in the same layer as the pixel electrode 70, and the upper gate line 40b layered on the lower gate line 40a and made of material having a higher electrical conductivity than the transparent conductive material of which the pixel electrode 70 is made. Therefore, it is possible to form both of the gate line 40 and the pixel electrode 70 at one exposure process.

In the liquid crystal panel 10, in particular, the connecting conductor 84 connected to the source electrode 54 of the TFT 50 and the pixel electrode 70 through the contact holes 92, 94, respectively, is made of material identical to the common electrode 80 and formed in the same layer as the common electrode 80. With the above, the connecting conductor 84 can be formed at the same process as the common electrode 80. Consequently, it is possible to prevent increase of the number of manufacturing processes for the connecting conductor 84.

Figure 11:
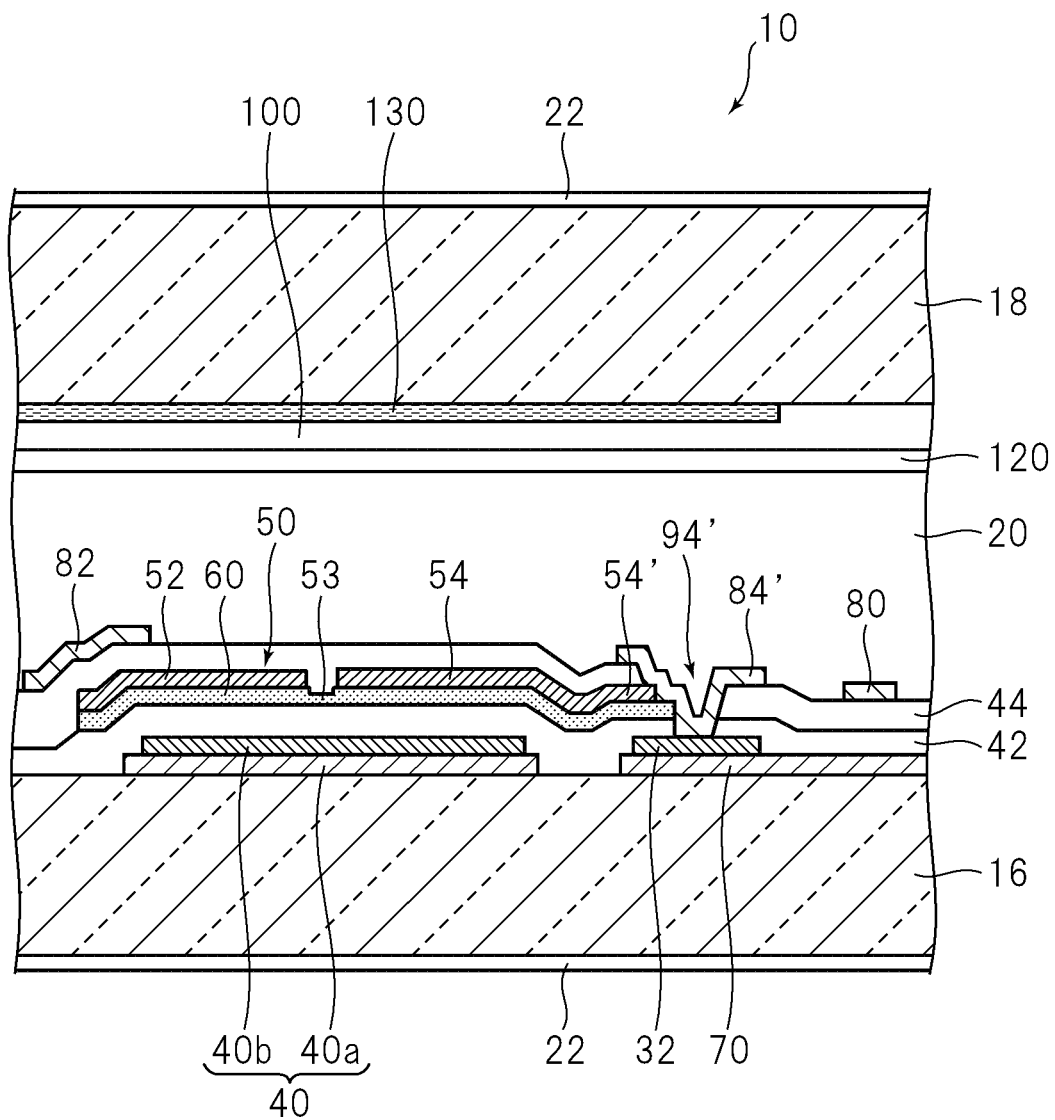
FIG. 11 is a diagram showing another example of a connection structure between a source electrode and a pixel electrode shown in FIG. 3.

Note that in the above-described example, the connecting conductor 84 is connected to the source electrode 54 and the pixel electrode 70 through the two contact holes 92, 94 positioned apart from each other. However, the connecting conductor 84 may be connected to the source electrode 54 and the pixel electrode 70 via a single contact hole. FIG. 11 is a cross sectional view showing another example of a structure for connection between the source electrode 54 and the pixel electrode 70, showing the same cross section as that shown in FIG. 3. Note that a member identical to that which is described above is given an identical reference numeral.

In this example, the source electrode 54 extends toward the pixel electrode 70, exceeding the edge of the gate line 40. An end part 54' of the source electrode 54 is positioned above the pixel electrode 70 (on the connecting pad 32 in this example), overlapping a part of the connecting pad 32 in a plan view. A contact hole 94' is formed in and penetrating the protective insulating film 44 and the gate insulating film 42. One contact hole 94' is formed such that the end part 54' of the source electrode 54 and a part of the connecting pad 32 are exposed. That is, the end part 54' of the source electrode 54 and the part of the connecting pad 32 are positioned inside the contact hole 94'. A connecting conductor (connection electrode) 84' connects the end part 54' of the source electrode 54 and the pixel electrode 70 (the connecting pad 32 in this example) together inside the contact hole 94'. As such a connecting conductor 84' is shorter, compared to the above described connecting conductor 84, the aperture ratio of each pixel can be improved. Note that the connecting conductor 84' as well is made of material identical to the common electrode 80, similar to the connecting conductor 84. The connecting conductor 84' can be formed at the same time as when the common electrode 80 is formed at the process shown in FIG. 10. Further, the source electrode 54' can be formed at the same time as the source electrode 54 at the process described with reference to FIG. 6.

Second Embodiment

Figure 12:
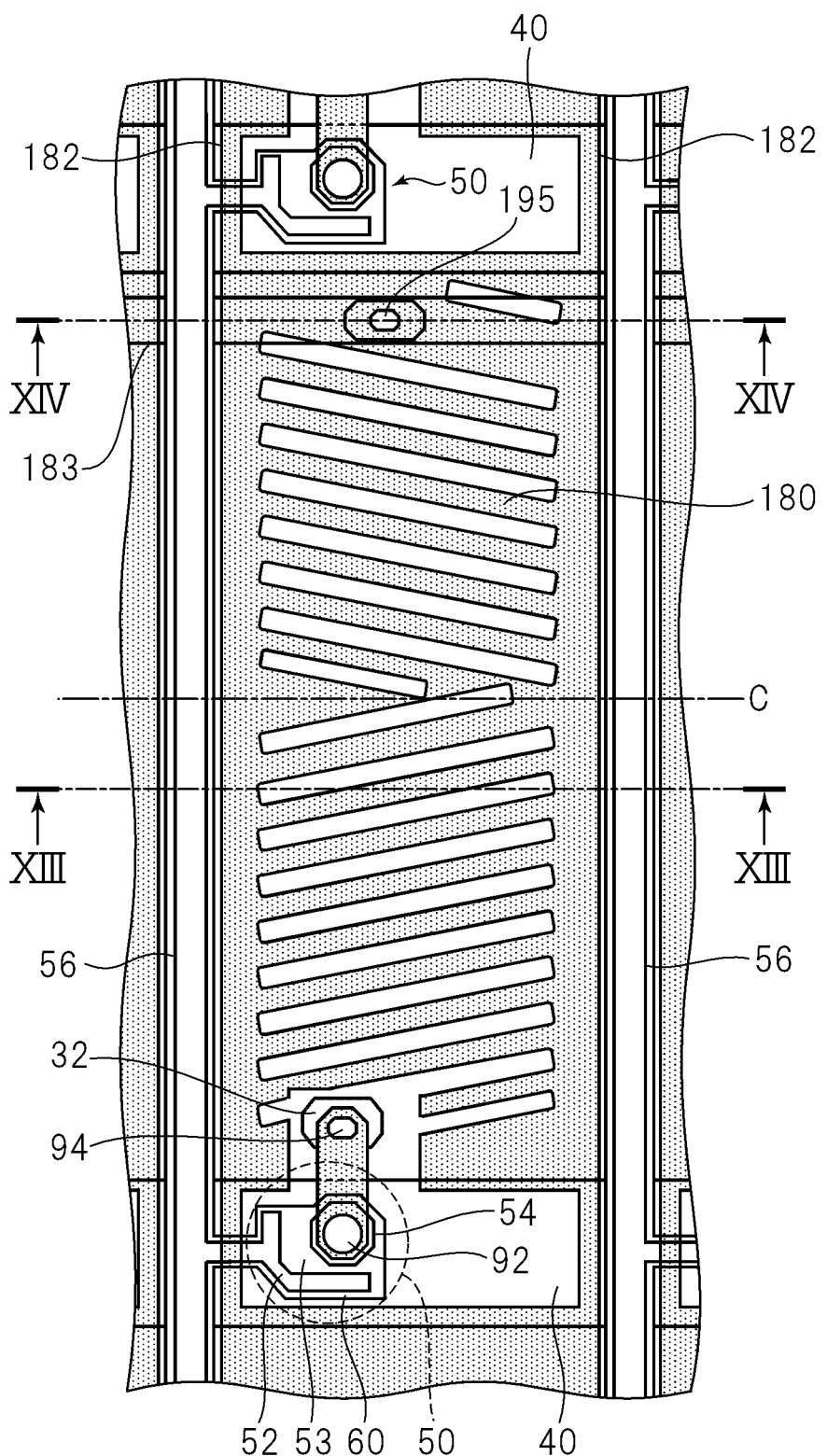
FIG. 12 is a plan view of a first substrate of a liquid crystal panel according to a second embodiment of the present invention.
Figure 13:
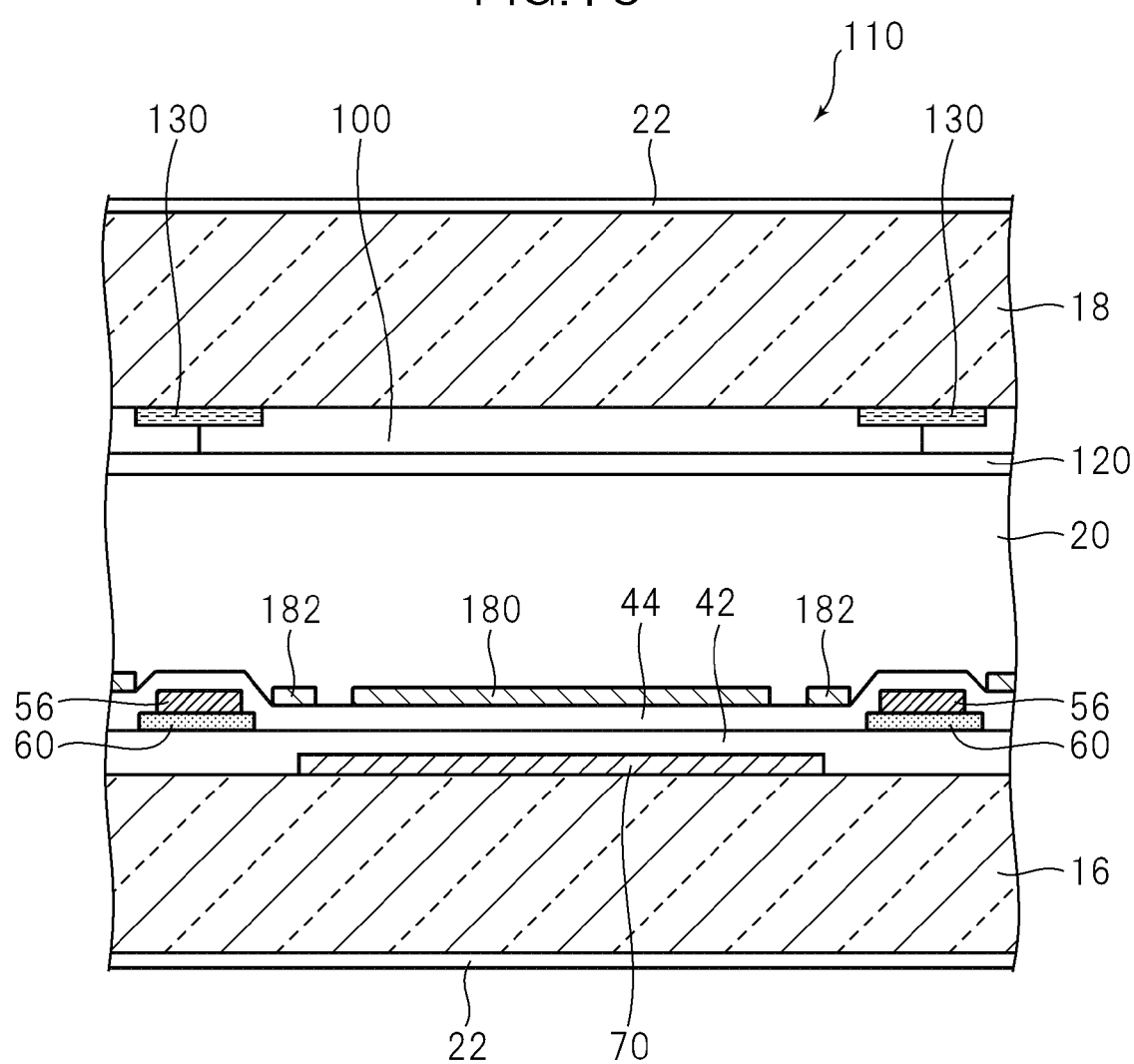
FIG. 13 is a cross sectional view of the first substrate shown in FIG. 12, with a cross section along the line XIII-XIII shown in FIG. 12.
Figure 14:
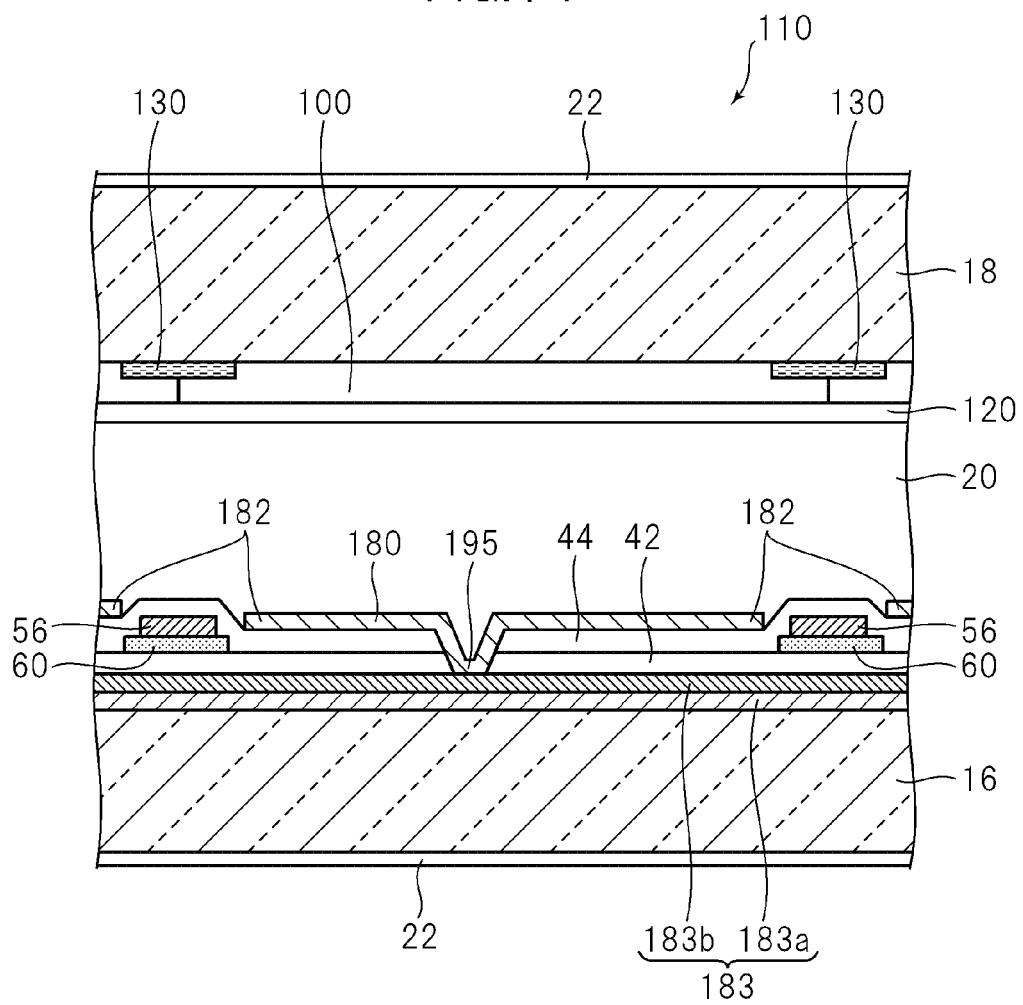
FIG. 14 is a cross sectional view of the first substrate shown in FIG. 12, with a cross section along the line XIV-XIV shown in FIG. 12.

FIG. 12 is a plan view of a first substrate of a liquid crystal panel 110 according to a second embodiment of the present invention. FIGS. 13 and 14 are cross sectional views of the liquid crystal panel 110 in this embodiment, showing cross sections along the line XIII-XIII and the line XIV-XIV, respectively, in FIG. 12. Note that a part identical to that which is described above is given an identical reference numeral in the respective diagrams.

In this embodiment, a common electrode 180 made of transparent conductive material is formed on the protective insulating film 44. In this example as well, slits are formed on the common electrode 180, but having a different shape from that of the common electrode 80 described above. That is, the slits on the common electrode 180 are formed diagonally extending from one common line 182 to another common line 182. A plurality of slits are formed symmetrical to each other about the central line C of each pixel.

Further, as shown in FIG. 13, the common line 182 in this example is formed along the drain line 56, but not covering the drain line 56. With the above, the capacitance between the drain line 56 and the common electrode 80 can be reduced. Consequently, it is possible to reduce delay in transmission of a video signal through the drain line 56.

As shown in FIG. 14, an auxiliary common line 183 is formed in a layer lower than the common electrode 180. The auxiliary common line 183 is formed in the same layer as the gate line 40 and the pixel electrode 70. That is, the auxiliary common line 183 is formed on the first substrate 16. Also, the auxiliary common line 183 is formed along the gate line 40. In other words, the auxiliary common line 183 is formed parallel to the gate line 40. Further, the auxiliary common line 183 is positioned closer to one of the two adjacent gate lines 40.

Similar to the gate line 40 described above, the auxiliary common line 183 has a two-layered structure. Specifically, the auxiliary common line 183 includes a lower auxiliary line 183a made of transparent conductive material identical to the pixel electrode 70 and the lower gate line 40a, and an upper auxiliary line 183b layered on the lower auxiliary line 183a and made of material identical to the upper gate line 40b. That is, the upper auxiliary line 183b is made of material having a higher electrical conductivity than the transparent conductive material.

The auxiliary common line 183 is electrically connected to the common electrode 180. This can reduce resistance of the common electrode 180. In this example, as shown in FIG. 14, a contact hole 195 is formed in the gate insulating film 42 and the protective insulating film 44. The auxiliary common line 183 is electrically connected to the common electrode 180 through the contact hole 195.

Such an auxiliary common line 183 can be formed at the same process as the pixel electrode 70 and the gate line 40, as shown in FIG. 5. That is, after the transparent conductive film 79, the conductor film 49, and the resist film 99 are layered on the first substrate 16 (5A in FIG. 5), the thin resist film 99A having a pattern corresponding to the shape of the gate line 40 and the auxiliary common line 183 and the thick resist film 99B having a pattern corresponding to the pixel electrode 70 are formed, using a multiple gradation mask. With the above, the auxiliary common line 183 can be formed without increasing the number of exposure processes.

Further, the contact hole 195 is formed at a process at which the contact holes 92, 94 shown in FIG. 7 are formed. That is, a resist film having a pattern corresponding to the contact holes 92, 94, 195 is formed on the protective insulating film 44 (see 7B in FIG. 7). Then, after the protective insulating film 44 and the gate insulating film 42 are etched, the resist film is removed. Through the above process, the contact holes 92, 94, 195 are formed. Other processes are similar to those in the first embodiment.

Third Embodiment

Figure 15:
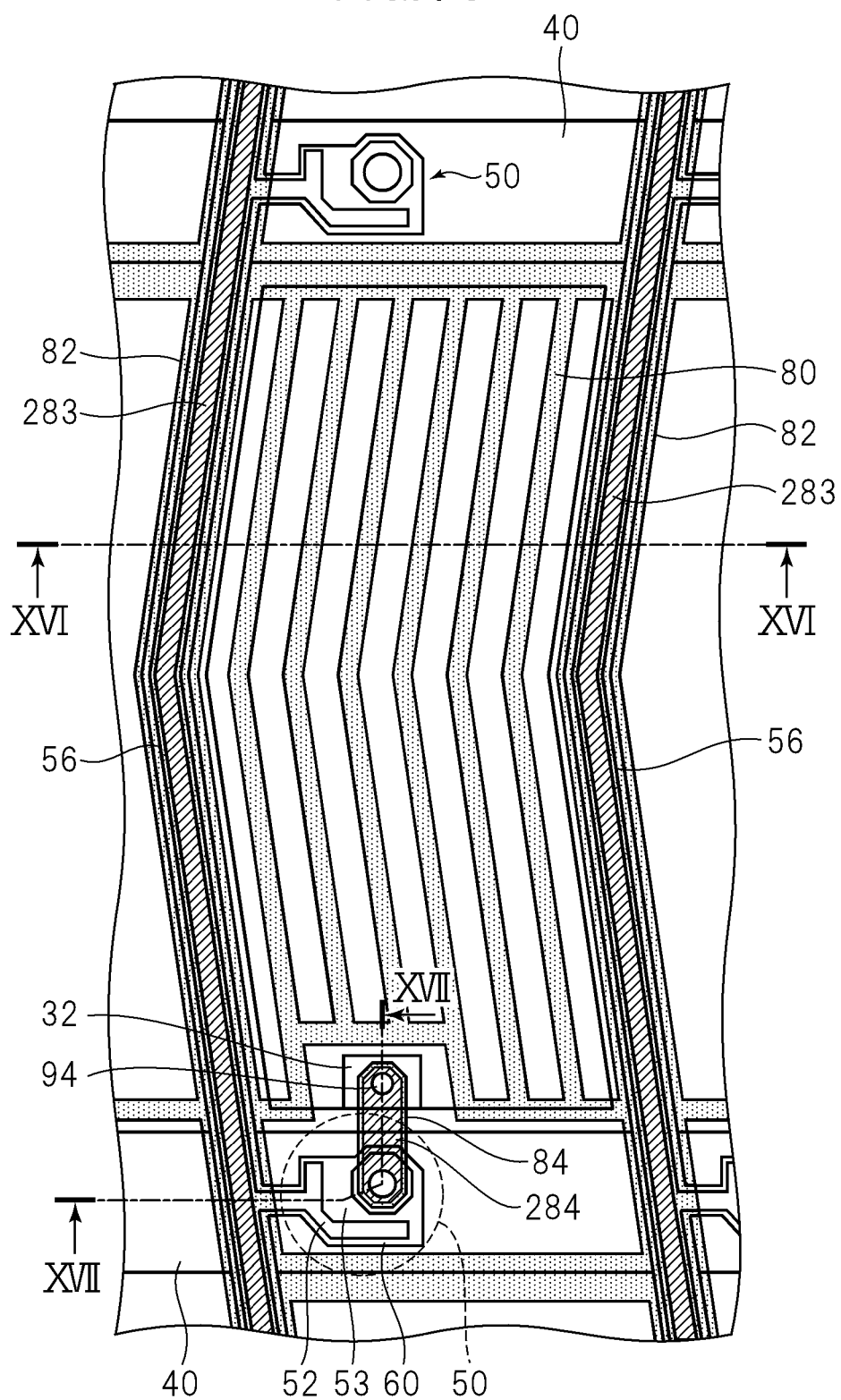
FIG. 15 is a plan view of a first substrate of a liquid crystal panel according to a third embodiment of the present invention.
Figure 16:
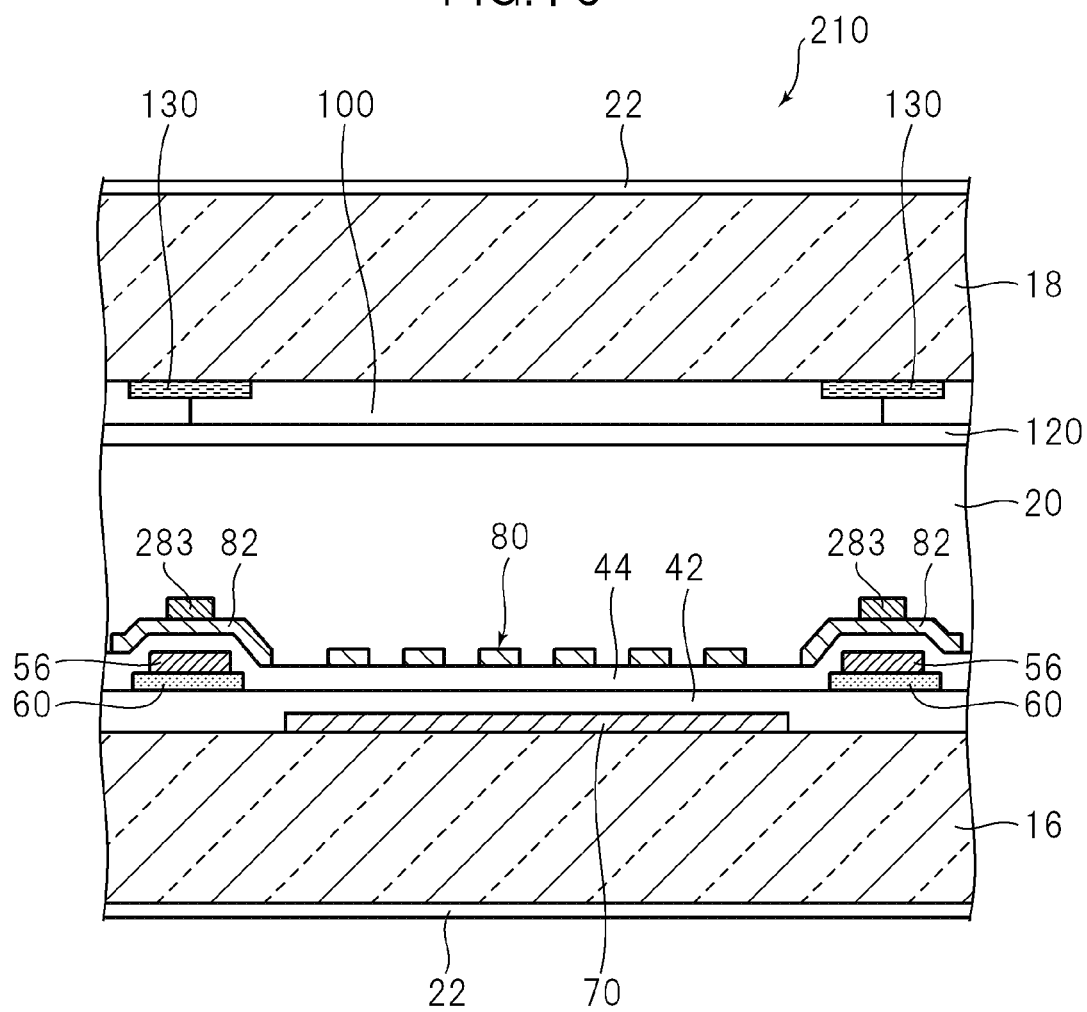
FIG. 16 is a cross sectional view of the first substrate shown in FIG. 15, with a cross section along the line XVI-XVI shown in FIG. 15.
Figure 17:
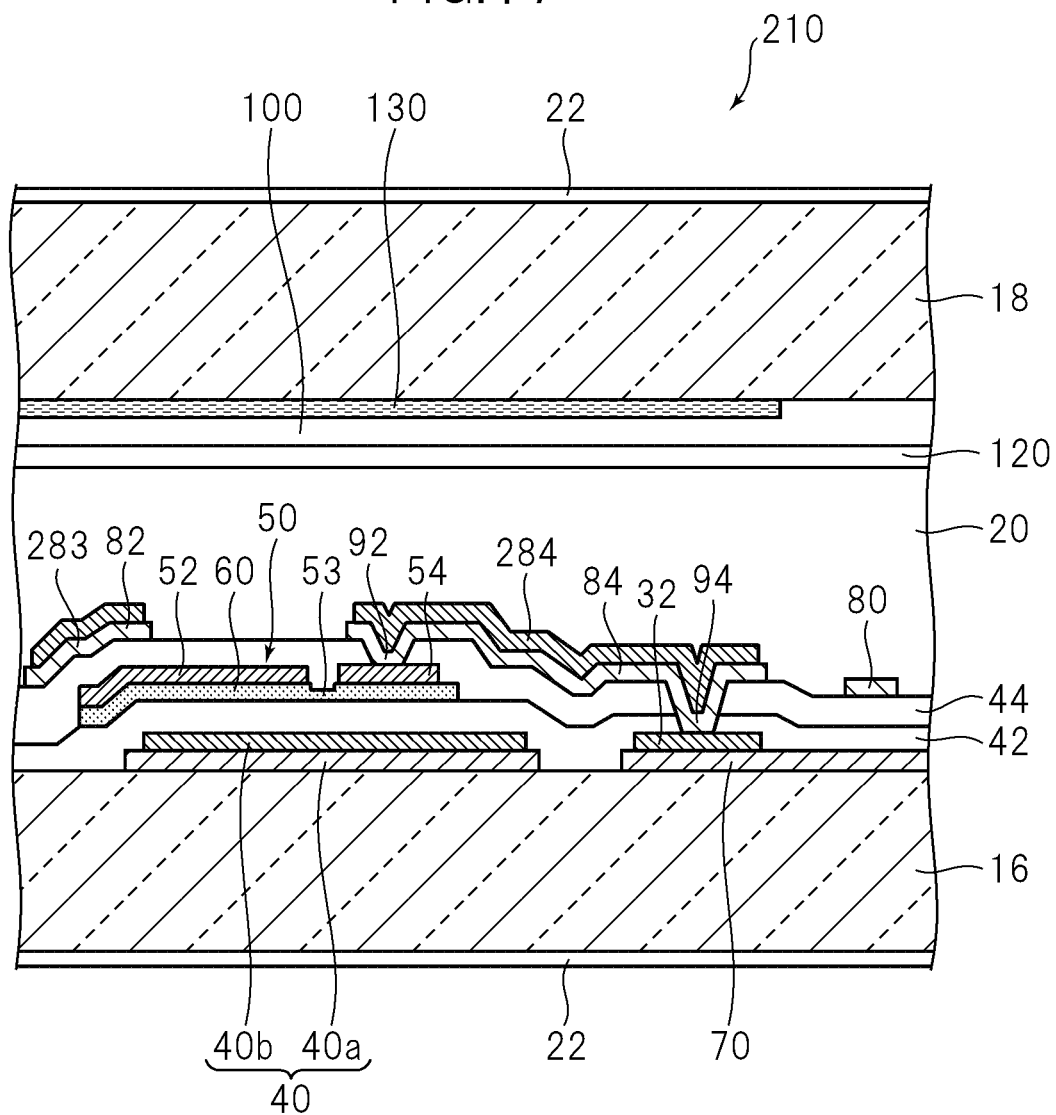
FIG. 17 is a cross sectional view of the first substrate shown in FIG. 15, with a cross section along the line XVII-XVII shown in FIG. 15.

FIG. 15 is a plan view of a first substrate of a liquid crystal panel 210 according to a third embodiment. FIGS. 16 and 17 are cross sectional views of the liquid crystal panel 210 in this embodiment, showing cross sections along the line XVI-XVI and the line XVII-XVII respectively in FIG. 15. Note that a member identical to that which is described above is given an identical reference numeral in the respective diagrams.

As shown in FIGS. 15 and 16, an auxiliary common line 283 is formed on the common electrode 80. The auxiliary common line 283 is made of material having a higher electrical conductivity than the transparent conductive material of which the common electrode 80 is made. Specifically, the auxiliary common line 283 is made of metal such as copper, molybdenum, aluminum. Therefore, the resistance of the common electrode 80 can be reduced.

Further, in this example, the auxiliary common line 283 is formed along the common line 82, being layered on the common line 82. The common line 82 is formed above the drain line 56 made of metal such as copper or the like. Thus, the auxiliary common line 283 can not invite drop of the aperture ratio of each pixel.

As shown in FIG. 17, the auxiliary connecting conductor 284 is layered on the connecting conductor 84. The auxiliary connecting conductor 284 is made of material having a higher electrical conductivity than the transparent conductive material of which the common electrode 80 and the connecting conductor 84 are made. Specifically, similar to the auxiliary common line 283, the auxiliary connecting conductor 284 is made of metal such as copper, molybdenum, aluminum, and so forth. The auxiliary connecting conductor 284 can reduce resistance of the connecting conductor 84.

A manufacturing method of a first substrate according to a third embodiment will be described. The manufacturing method of the first substrate 16 in this embodiment is substantially identical to that for forming the first substrate 16 of the liquid crystal panel 10 according to the first embodiment, but differs in the fourth exposure process shown in FIG. 10. FIGS. 18A to 18D are diagrams showing the fourth exposure process in manufacturing the first substrate according to the third embodiment. In FIGS. 18A to 18D, (a) is a cross sectional view showing a cross section along the line XVI-XVI shown in FIG. 15, and (b) is a cross sectional view showing a cross section along the line XVII-XVII shown in FIG. 15.

In this embodiment, a multiple gradation mask is used in forming the common electrode 80 and the connecting conductor 84 as well. Therefore, the auxiliary connecting conductor 284 and the auxiliary common line 283 can be formed without increasing the number of exposure processes. Specifically, as shown in FIG. 18A, the transparent conductive film 89 and a conductor film 289 for forming the auxiliary common line 283 and the auxiliary connecting conductor 284 are layered on the protective insulating film 44, and the resist film 97 is further formed on the conductor film 289.

Thereafter, as shown in FIG. 18B, the resist film 97 is patterned through an exposure process using a multiple gradation mask and a development process, whereby resist films 97A, 97B having different thickness are formed on the conductor film 289. That is, the thin resist film 97A having a pattern corresponding to the shape of the common electrode 80 and the thick resist film 97B having a pattern corresponding to the shape of the auxiliary common line 283 and the auxiliary connecting conductor 284 are formed. In the above, the thick resist film 97B is thicker than the thin resist film 97A.

Thereafter, as shown in FIG. 18C, the conductor film 289 and the transparent conductive film 89 are etched using both of the thin resist film 97A and the thick resist film 97B as a mask. Thereafter, as shown in FIG. 18D, the thin resist film 97A is removed. As a result of the removing process, the thick resist film 97B is left having become thinner. Thereafter, the conductor film 289 is etched using the residual thick resist film 97B as a mask, and thereafter, the thick resist film 97B is completely removed. As a result, the auxiliary common line 283 and the auxiliary connecting conductor 284 shown in FIGS. 15 and 16 are formed. Other processes are similar to those in the first embodiment.

Fourth Embodiment

Figure 19:
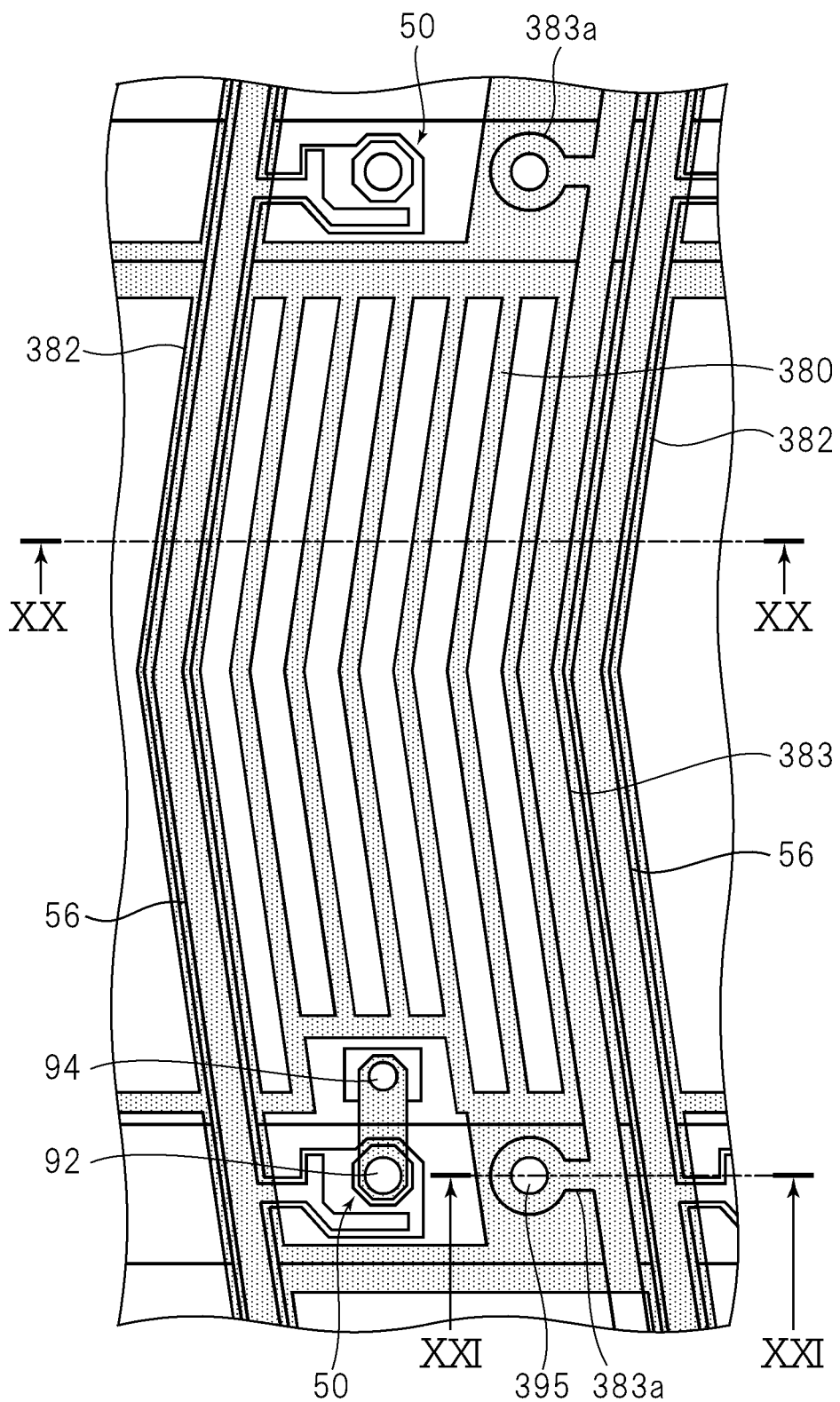
FIG. 19 is a plan view of a first substrate of a liquid crystal panel according to a fourth embodiment of the present invention.
Figure 20:
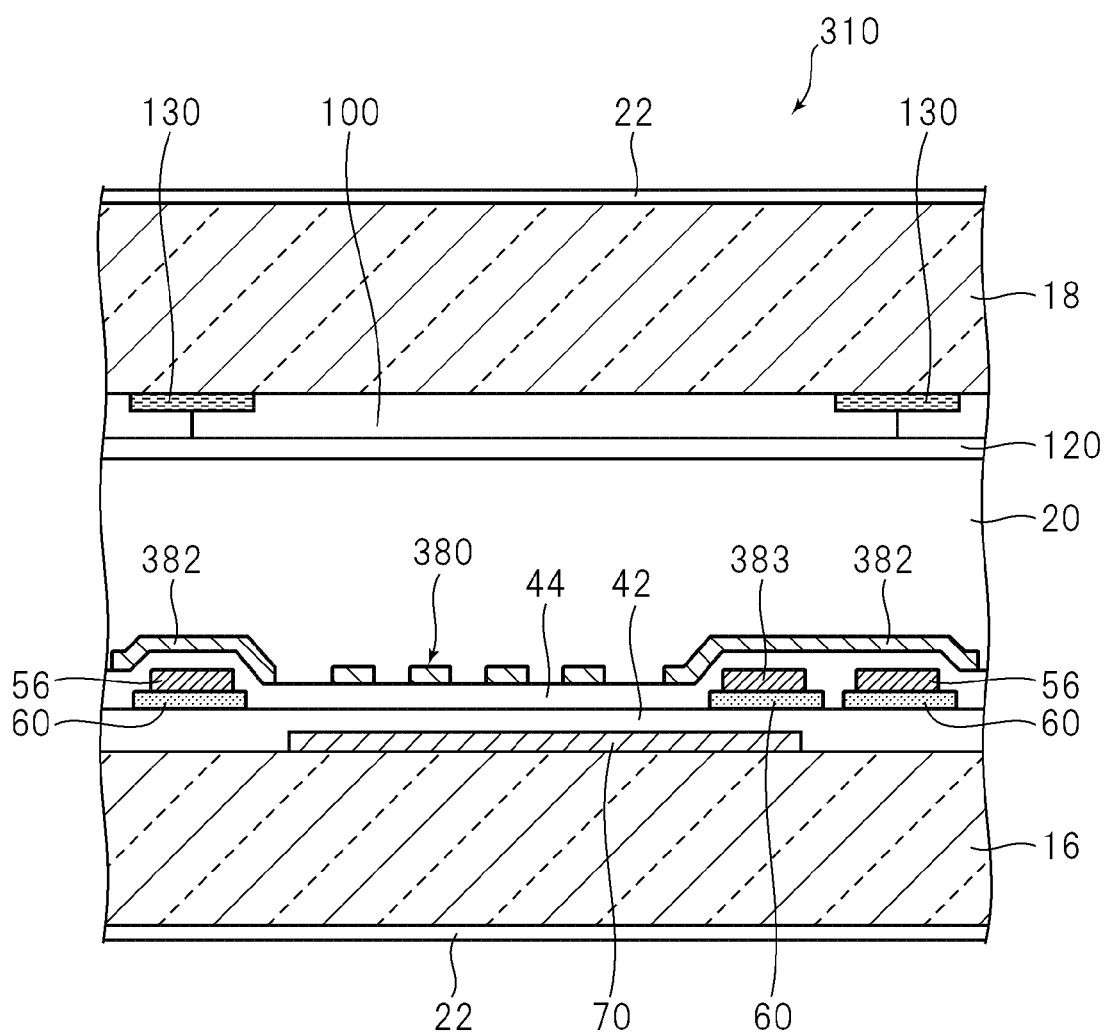
FIG. 20 is a cross sectional view of the first substrate shown in FIG. 19, with a cross section along the line XX-XX shown in FIG. 19.
Figure 21:
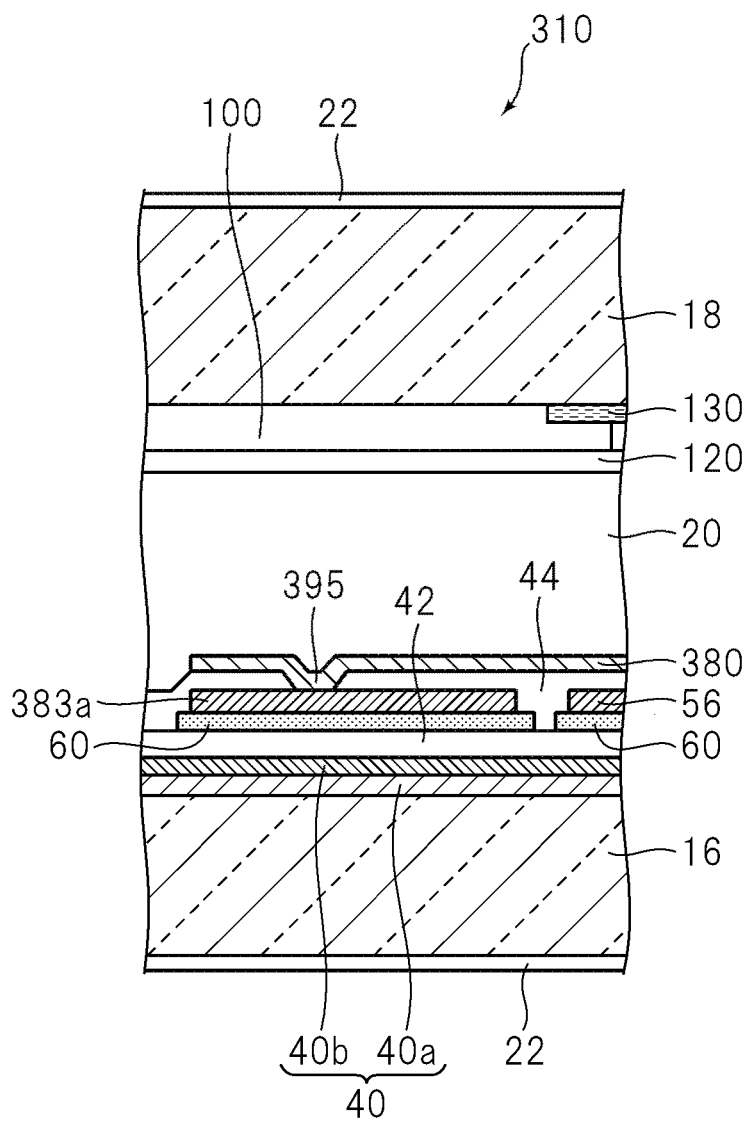
FIG. 21 is a cross sectional view of the first substrate shown in FIG. 19, with a cross section along the line XXI-XXI shown in FIG. 19.

FIG. 19 is a plan view of a first substrate of a liquid crystal panel 310 according to a fourth embodiment of the present invention. FIGS. 20 and 21 are cross sectional views of the liquid crystal panel 310 in this embodiment, showing cross sections along the line XX-XX and the line XXI-XXI, respectively, in FIG. 19.

As shown in FIGS. 19 and 20, in this embodiment, an auxiliary common line 383 is formed in the same layer as the drain line 56. The auxiliary common line 383 is formed along the drain line 56. Specifically, the auxiliary common line 383 is formed parallel to the drain line 56 and closer to one of the two adjacent drain lines 56.

As shown in FIG. 20, the common line 382 is positioned above and covering the auxiliary common line 383 and the drain line 56. That is, the common line 382 is formed along the auxiliary common line 383 and the drain line 56, overlapping these lines in a plan view.

As shown in FIG. 21, the auxiliary common line 383 is connected to the common electrode 380 through the contact hole 395 formed in the protective insulating film 44. Specifically, the auxiliary common line 383 includes a connection part 383a, and the contact hole 395 is formed on the connection part 383a. In this example, the connection part 383a projects from the auxiliary common line 383 in the direction along the gate line 40 to be positioned on the gate line 40. With this arrangement, drop of the aperture ratio of each pixel due to the connection part 383a can be prevented. Note that such a connection part 383a projecting from the auxiliary common line 383 may not be provided. That is, the contact hole 395 may be formed on the auxiliary common line 383.

Similar to the drain line 56, the auxiliary common line 383 as well has a two-layered structure containing the semiconductor layer 60 and a conductor layer layered on the semiconductor layer 60. That is, in this embodiment, the semiconductor layer 60 is patterned into a shape corresponding to the source electrode 54, the drain electrode 52, the drain line 56, and the auxiliary common line 383.

Such an auxiliary common line 383 can be formed at the process at which the drain line 56 is formed, without increasing the number of exposure processes. Specifically, at the process described with reference to FIG. 6, the semiconductor layer 60 and a conductor film for forming the drain line 56, the auxiliary common line 383 and so forth are layered on the gate insulating film 42. Thereafter, a resist film is formed on the conductor film. Then, the resist film is patterned through an exposure process using a multiple gradation mask and a development process. That is, a thin resist film having a pattern corresponding to the channel 53 and a thick resist film having a pattern corresponding to a part having a two-layered structure, such as the drain line 56, the auxiliary common line 383 and so forth, are formed on the conductor film. Then, the channel 53, the source electrode 54, the drain electrode 52, the drain line 56, and the auxiliary common line 383 are formed using the thin resist film and the thick resist film.

Further, the contact hole 395 is formed at the process at which the contact holes 92, 94 shown in FIG. 7 are formed. That is, a resist film having a pattern corresponding to the contact holes 92, 94, 395 is formed on the protective insulating film 44 (see 7B in FIG. 7). Then, after the protective insulating film 44 and the gate insulating film 42 are etched, the patterned resist film is removed. With those processes, the contact holes 92, 94, 395 are formed. Other processes are similar to those in the first embodiment.

Fifth Embodiment

Figure 22:
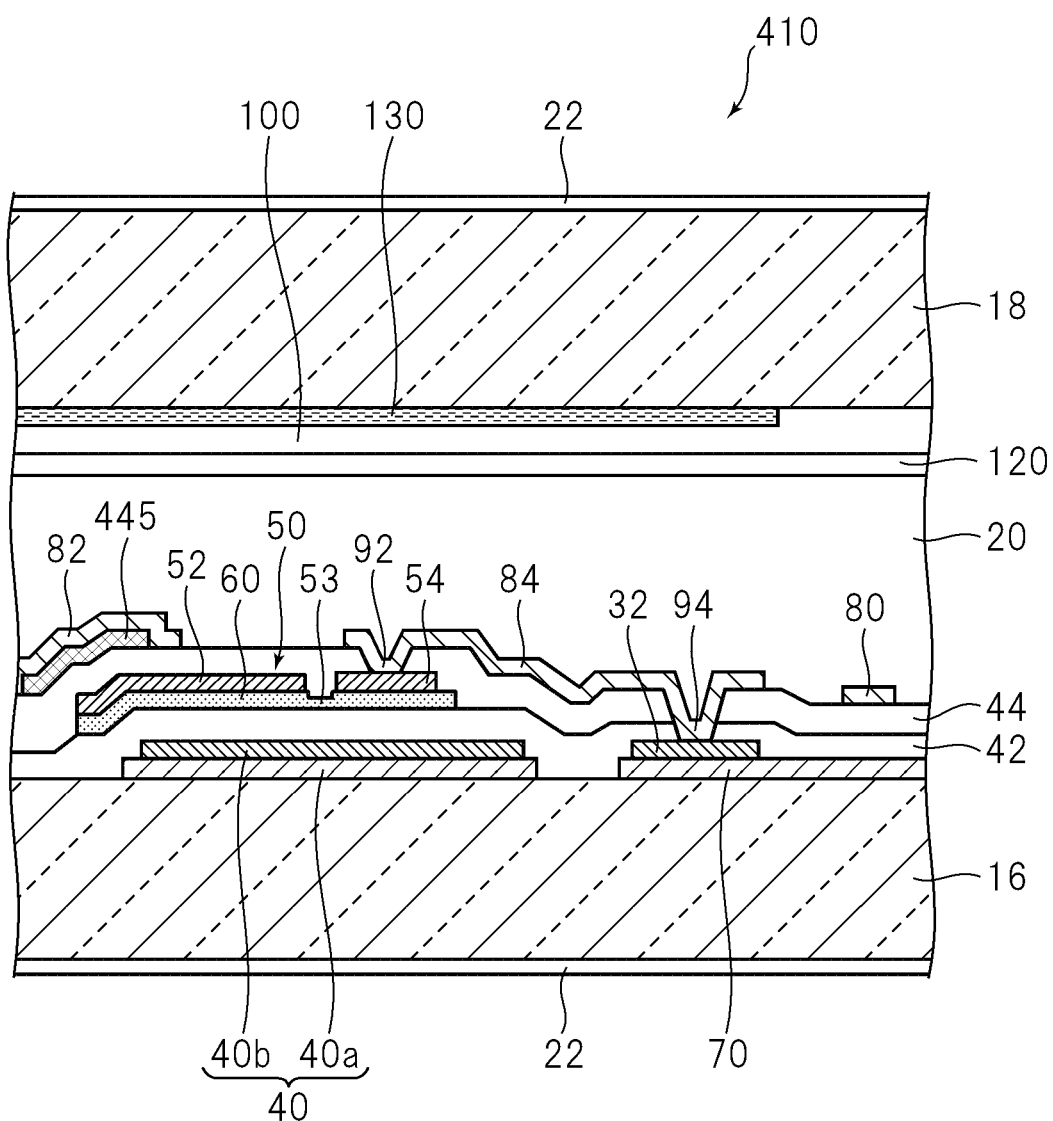
FIG. 22 is a cross sectional view of a liquid crystal panel according to a fifth embodiment of the present invention, with the cross section same as that along the line shown in FIG. 2.
Figure 23:
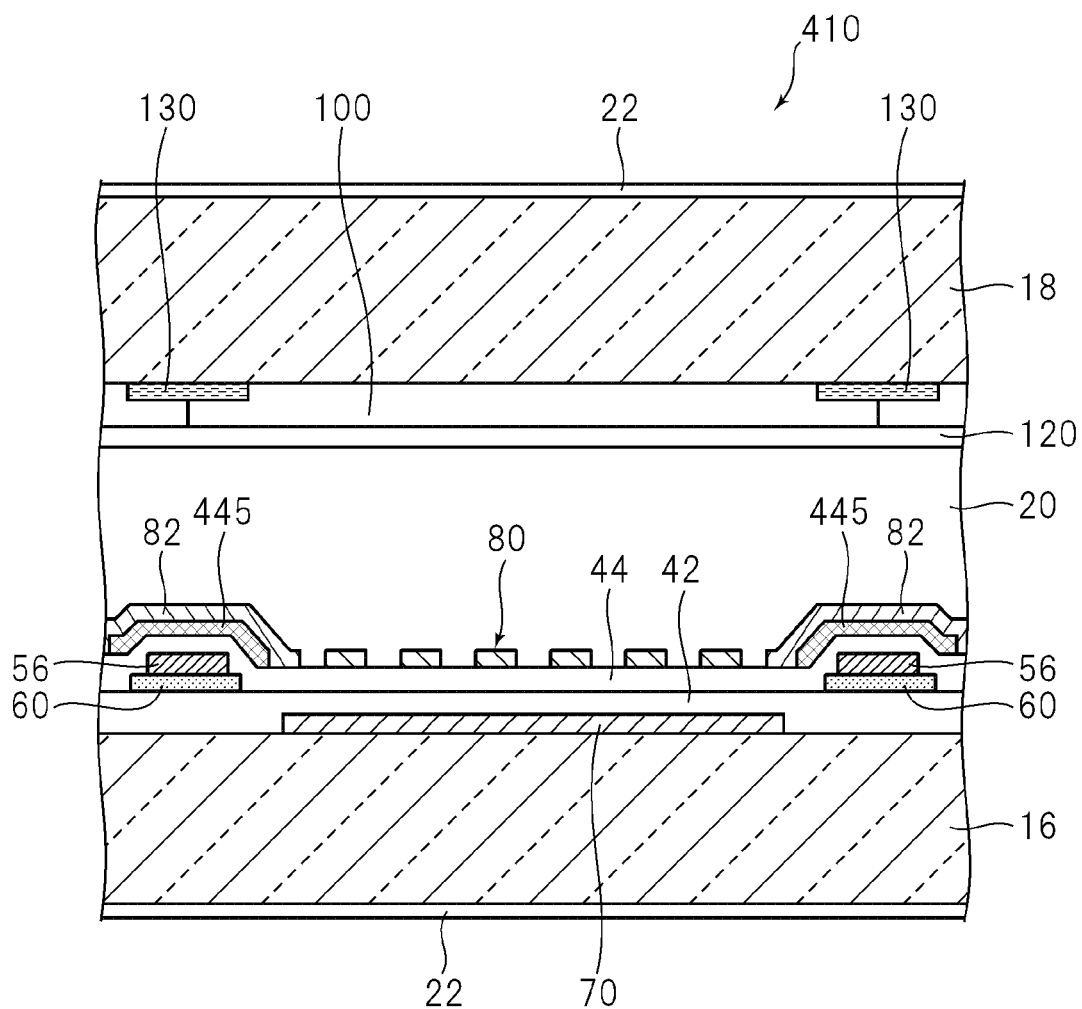
FIG. 23 is a cross sectional view of the liquid crystal panel according to the fifth embodiment of the present invention, with the cross section same as that along the line IV-IV shown in FIG. 2.

FIGS. 22 and 23 are cross sectional views of a liquid crystal panel 410 according to a fifth embodiment of the present invention. The cross section shown in FIG. 22 is the same as the cross section along the line III-III shown in FIG. 2. The cross section shown in FIG. 23 is the same as the cross section along the line IV-IV shown in FIG. 2.

In this embodiment, similar to the first embodiment, the common electrode 80 is formed such that it is partially positioned above the drain line 56. Specifically, the common line 82 formed integral with the common electrode 80 is positioned above the drain line 56. In this embodiment, an additional insulating portion 445 is formed between the common line 82 and the drain line 56. The additional insulating portion 445 is formed along the common line 82 and the drain line 56, and on the protective insulating film 44. That is, the additional insulating portion 445 is formed only between the common line 82 and the drain line 56, but not in other parts. With this structure, drop of a light transmissivity due to the additional insulating portion 445 can be prevented.

The additional insulating portion 445 is made of material having a lower dielectric constant than the protective insulating film 44. For example, in the case where $SiO_2$ or $SiN_x$ is used for the protective insulating film 44, an organic material having a relative dielectric constant equal to 4 or smaller is used for the additional insulating portion 445.

In this embodiment, the additional insulating portion 445 is made of material (e.g., photosensitivity acrylic resin) that can function as a resist film in an etching process for the protective insulating film 44. As a result, the additional insulating portion 445 can be formed on the protective insulating film 44 without increasing the number of exposure processes.

Figure 24:
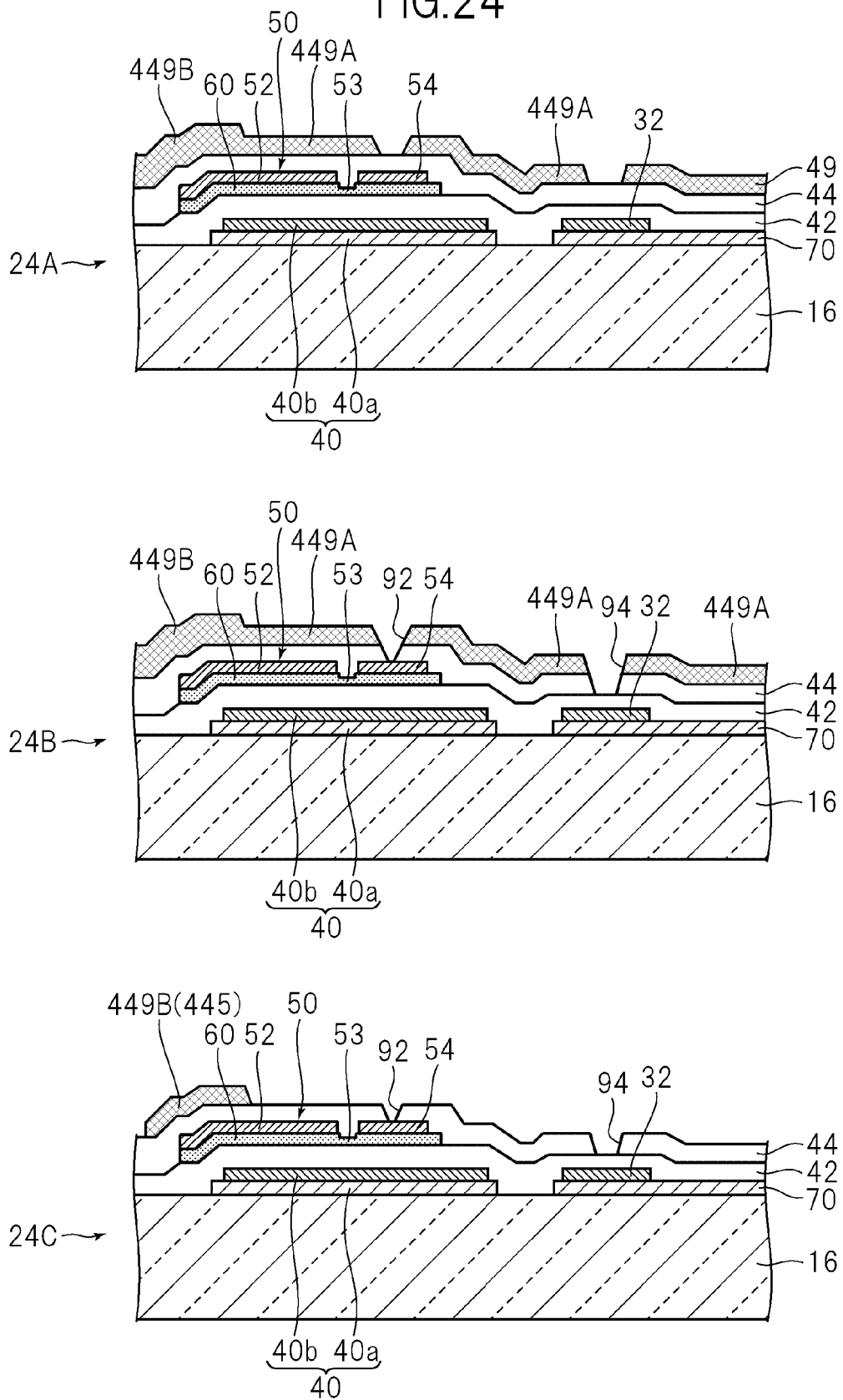
FIG. 24 is a diagram showing a process forming an additional insulating portion in the fifth embodiment.

FIG. 24 is a diagram showing a process of forming the additional insulating portion 445. Note that the respective processes shown in 24A, 24B, and 24C in FIG. 24 correspond to the respective processes shown in 7A, 7B, and 7C in FIG. 7. Below, a process different from the manufacturing process according to the first embodiment will be mainly described.

Initially, the protective insulating film 44 and a resist film 449 for forming the additional insulating portion 445 are formed on the gate insulating film 42 so as to cover the TFT 50. Thereafter, as shown in 24A in FIG. 24, the resist film 449 is patterned through an exposure process and a development process. At the exposure process, two resist films having different thickness that are patterned using a multiple gradation mask are formed on the protective insulating film 44. That is, a thin resist film 449A having the contact holes 92, 94 and the openings 43a, 43b (see FIGS. 8 and 9) formed on the terminals of the gate lines 40, 56 and a thick resist film 449B having a shape corresponding to the additional insulating portion 445 are formed. The thick resist film 449B is positioned above and formed along the drain line 56.

Thereafter, as shown in 24B, the protective insulating film 44 and the gate insulating film 42 are etched to thereby form the contact holes 92, 94 and the openings 43a, 43b on the terminals. Thereafter, as shown in 24C, the thin resist film 449A is removed. In this removing process, the thick resist film 449B becomes thinner as a result that the thick resist film 449B is soaked in a remover solution used in this process. Then, the residual thick resist film 449B constitutes the additional insulating portion 445. Thereafter, the common line 82 is formed on the additional insulating portion 445 through the process shown in FIG. 10.

While there have been described what are at present considered to be certain embodiments of the invention, it will be understood that various modifications may be made thereto, and it is intended that the appended claims cover all such modifications as fall within the true spirit and scope of the invention.

What is claimed is:

1. A liquid crystal panel comprising:
   first and second substrates sandwiching a liquid crystal material;
   a thin film transistor formed on the first substrate;
   a pixel electrode formed on the first substrate and made of a transparent conductive material;
   a common electrode formed on the first substrate and made of a transparent conductive material;
   a gate line connected to the thin film transistor, being positioned in a common layer with the pixel electrode;
   a first insulating layer covering the gate line and the pixel electrode;
   a second insulating layer covering the first insulating layer;
   a contact hole penetrating both the first insulating layer and the second insulating layer so as to reach the pixel electrode; and
   a connecting conductor in the contact hole,
   wherein the thin film transistor comprises a source electrode that is present between the first and second insulating layers and is partially exposed from the second insulating layer at the contact hole, the common electrode is formed on the second insulating layer, the pixel electrode is electrically connected with the source electrode via the connecting conductor, with said contact hole being the sole contact hole for the electrical connection of the source electrode and the pixel electrode, and an end part of the source electrode is exposed from the second insulating layer and is connected to the connecting conductor.

2. The liquid crystal panel according to claim 1, wherein the source electrode overlaps the pixel electrode in a plan view.

3. The liquid crystal panel according to claim 1, wherein the connecting conductor is made of the same transparent conductive material as the common electrode and positioned in a common layer with the common electrode.

* * * * *